(12) United States Patent
Park et al.

(10) Patent No.: US 12,059,880 B2
(45) Date of Patent: Aug. 13, 2024

(54) DISPLAY DEVICE INCLUDING AN ADHESIVE MEMBER, AND MANUFACTURING METHOD OF DISPLAY DEVICE

(71) Applicant: SAMSUNG DISPLAY CO., LTD., Yongin-si (KR)

(72) Inventors: Young Ok Park, Seoul (KR); Jun Woo You, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 551 days.

(21) Appl. No.: 17/342,884

(22) Filed: Jun. 9, 2021

(65) Prior Publication Data
US 2022/0088913 A1  Mar. 24, 2022

(30) Foreign Application Priority Data
Sep. 18, 2020  (KR) .................. 10-2020-0120273

(51) Int. Cl.
*B32B 37/12* (2006.01)
*H10K 59/131* (2023.01)

(52) U.S. Cl.
CPC ....... *B32B 37/1284* (2013.01); *H10K 59/131* (2023.02); *B32B 2037/1269* (2013.01); *B32B 2457/206* (2013.01)

(58) Field of Classification Search
CPC ........ B32B 37/1284; B32B 2037/1269; B32B 2457/206; H10K 59/131; H10K 59/12; H05K 1/189; H05K 2201/10128; H05K 3/323; C09J 7/20; C09J 2301/1242; C09J 2400/10; C09J 2433/00; C09J 2463/00; C09J 9/02; C09J 11/044; C09J 133/04; C09J 163/00; C09J 2203/318; C09J 2301/12

See application file for complete search history.

(56) References Cited

U.S. PATENT DOCUMENTS

| | | |
|---|---|---|
| 5,045,249 A | 9/1991 | Jin et al. |
| 5,431,571 A | 7/1995 | Hanrahan et al. |
| 5,736,681 A | 4/1998 | Yamamoto et al. |

FOREIGN PATENT DOCUMENTS

| | | | |
|---|---|---|---|
| JP | 2006332224 A | * | 12/2006 |
| KR | 20140078146 A | * | 6/2014 |
| KR | 10-2016-0128536 | | 11/2016 |
| KR | 10-1987917 | | 6/2019 |
| KR | 10-2019-0078457 | | 7/2019 |

OTHER PUBLICATIONS

JP2006332224-A Machine Translation of Description (Year: 2024).*

(Continued)

*Primary Examiner* — Cynthia L Schaller
(74) *Attorney, Agent, or Firm* — F. CHAU & ASSOCIATES, LLC

(57) ABSTRACT

An adhesive member includes: a base layer; a first adhesive layer disposed on a first surface of the base layer; a second adhesive layer disposed on a second surface of the base layer opposite to the first surface of the base layer; a plurality of through holes passing through the base layer, the first adhesive layer, and the second adhesive layer; and a plurality of conductive members disposed in the plurality of through holes, respectively.

8 Claims, 19 Drawing Sheets

(56) References Cited

OTHER PUBLICATIONS

KR20140078146-A Machine Translation of Description (Year: 2024).*
Lin et al., "Fabrication of Nanowire Anisotropic Conductive Film for Ultra Fine Pitch Flip Chip Interconnection", 2005 Electronic Components and Technology Conference, pp. 66-70.
Lin et al., "Design of Nanowire Anisotropic Conductive Film for Ultra Fine Pitch Flip Chip Interconnection", 2004 Electronics Packaging Technology Conference, pp. 120-125.
Tao et al., "Nanowire Based Anisotropic Conductive Film for Low Temperature 3D Stacking Applications", Minapad 2014, May 21-22, Grenoble; France, 4 Pages.
Jung et al., "Preparation of Anodic Aluminum Oxide Masks With Size-Controlled Pores for 2D Plasmonic Nanodot Arrays", Journal of Nanomaterials, vol. 2018, pp. 1-9.
Zhang et al., "Controlled Synthesis of Pt Nanowires with Ordered Large Mesopores for Methanol Oxidation Reaction", Scientific Reports vol. 6, Article No. 31440 (2016), pp. 1-8.
Tavakoli et al., "Non-Catalytic Vapor Growth Regime for Organohalide Perovskite Nanowires Using Anodic Aluminum Oxide Templates", Royal Society of Chemistry, Mar. 2017, pp. 1-13.
Zu et al., "Porous AAO template-assisted rational synthesis of large-scale 1D hybrid and hierarchically branched nanoarchitectures", Progress in Materials Science, vol. 95, Jun. 2018, pp. 243-285.

* cited by examiner

Fig. 3
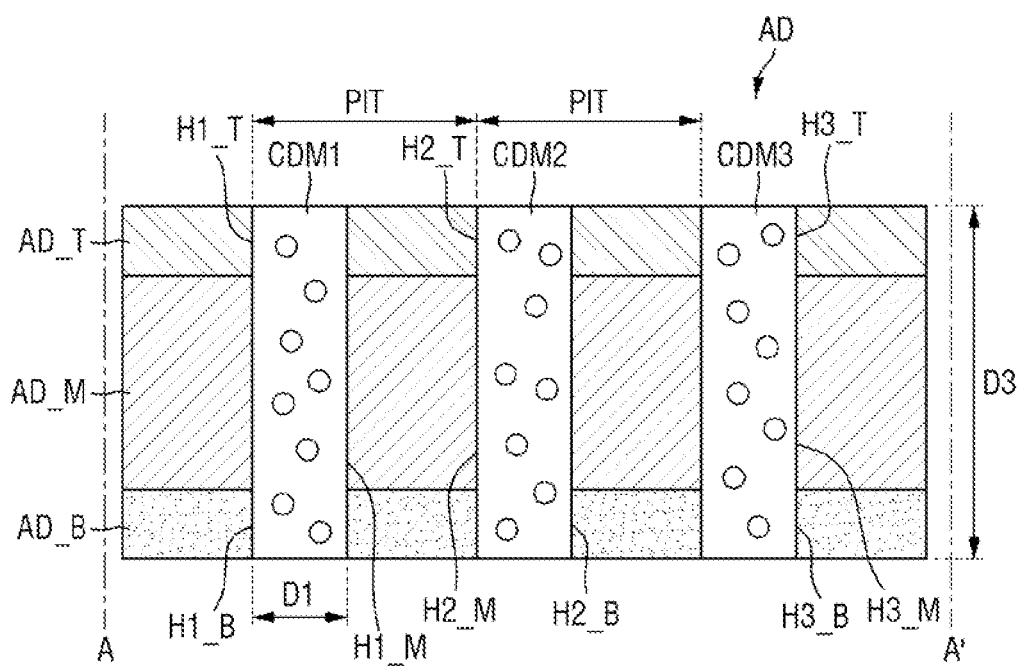
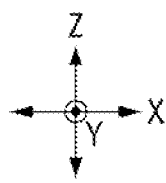

H : H1,H2,H3

H : H1,H2,H3
CDM : CDM1,CDM2,CDM3

DISPLAY DEVICE INCLUDING AN ADHESIVE MEMBER, AND MANUFACTURING METHOD OF DISPLAY DEVICE

CROSS-REFERENCE TO RELATED APPLICATION

This application claims priority under 35 U.S.C. § 119 to Korean Patent Application No. 10-2020-0120273 filed on Sep. 18, 2020 in the Korean Intellectual Properly Office, the disclosure of which is incorporated by reference herein in its entirety.

TECHNICAL FIELD

The present inventive concept relates to a display device including an adhesive member, and a method of manufacturing the display device.

DISCUSSION OF THE RELATED ART

Display devices are employed in a variety of electronic devices such as a smart phone, a tablet personal computer (PC), a laptop computer, a monitor and a television. Typically, display devices may include a display panel, a printed circuit board, and a main circuit board. The printed circuit board may be connected to the display panel, and the main circuit board may be connected to the printed circuit board. Generally, the printed circuit board may be connected to the display panel by an adhesive.

SUMMARY

According to an embodiment of the present inventive concept, an adhesive member includes: a base layer; a first adhesive layer disposed on a first surface of the base layer; a second adhesive layer disposed on a second surface of the base layer opposite to the first surface of the base layer; a plurality of through boles passing through the base layer, the first adhesive layer, and the second adhesive layer; and a plurality of conductive members disposed in the plurality of through holes, respectively.

In an embodiment of the present inventive concept, the plurality of through holes are arranged to have a predetermined pitch in a first direction.

In an embodiment of the present inventive concept, each of the plurality of through holes has a width in the first direction and a length in a second direction intersecting the first direction, wherein the width is less than the length.

In an embodiment of the present in inventive concept, the first adhesive layer includes an acrylic-based resin, and the second adhesive layer includes an epoxy-based resin.

In an embodiment of the present inventive concept, the conductive member has a resistance that varies when pressed in a thickness direction.

In an embodiment of the present inventive concept, the conductive method includes at least one of a nanowire, a nanospring, or a conductive ball.

In an embodiment of the present inventive concept, the base layer includes aluminum oxide.

In an embodiment of the present inventive concept, the base layer includes an anodic aluminum oxide template.

According to an embodiment of the present inventive concept, a display device includes: a display panel including a plurality of signal lines; a printed circuit board including a plurality of lead lines overlapping the plurality of signal lines in a thickness direction, respectively; and an adhesive member interposed between the display panel and the printed circuit board, wherein the adhesive member includes a plurality of through holes and a plurality of conductive members, wherein the plurality of through holes are arranged at the same pitch as that of the plurality of signal lines and the plurality of lead lines, wherein each of the plurality of through holes has a first side opening, in which one lead line of the plurality of lead lines is accommodated, and a second side opening, in which one signal line of the plurality of signal lines is accommodated, and wherein the plurality of conductive members are respectively disposed in the plurality of through holes.

In an embodiment of the present inventive concept, the adhesive member includes: a base layer; a first adhesive layer interposed between the base layer and the printed circuit board; and a second adhesive layer interposed between the base layer and the display panel. The plurality of through holes pass through the base layer, the first adhesive layer, and the second adhesive layer in the thickness direction. The plurality of conductive members are disposed in the plurality of through holes, respectively.

In an embodiment of the present inventive concept, the first adhesive layer includes an acrylic-based resin, and the second adhesive layer includes an epoxy-based resin.

In an embodiment of the present inventive concept, the conductive member includes at least one of a nanowire, a nanospring, or a conductive ball.

In an embodiment of the present inventive concept, the base layer includes aluminum oxide.

In an embodiment of the present inventive concept, the base layer includes an anodic aluminum oxide template.

In an embodiment of the present inventive concept, each of the plurality of signal lines and each of the plurality of lead lines are spaced apart from respective inner side surfaces of the plurality of through holes.

In an embodiment of the present inventive concept, in each of the through holes, a size of the first side opening is different from a size of the second side opening.

According to an embodiment of the present inventive concept, a method of manufacturing a display device includes: forming a plurality of through holes in a base layer; forming a first adhesive layer on a first surface of the base layer; forming a second adhesive layer on a second surface of the base layer, wherein the second surface of the base layer is opposite to the first surface of the base layer; and filling the plurality of through holes with a plurality of conductive members, respectively.

In an embodiment of the present inventive concept, the method further includes interposing the base layer, the first adhesive layer, and the second adhesive layer between a display panel and a printed circuit board to bond the display panel and the printed circuit board to each other.

In an embodiment of the present inventive concept, the bonding of the display panel and the printed circuit board limber includes aligning a plurality of signal lines of the display panel, a plurality of lead lines of the printed circuit board, and the plurality of conductive members to overlap each other in a thickness direction and applying pressure to insert the plurality of signal lines and the plurality of lead lines into the plurality of through holes, respectively.

In an embodiment of the present inventive concept, the forming of the plurality of through holes includes forming patterns on an aluminum plate and anodizing the aluminum plate.

BRIEF DESCRIPTION OF THE DRAWINGS

The above and features of the present inventive concept will become more apparent by describing embodiments thereof in detail with reference to the accompanying drawings, in which:

FIG. 3 is a cross-sectional view taken along line A-A' of FIG. 1;

DETAILED DESCRIPTION OF THE EMBODIMENTS

The present inventive concept will now be described more fully hereinafter with reference to the accompanying drawings, in which embodiments of the present inventive concept are illustrated. The present inventive concept may, however, be embodied in different forms and should not be construed as limited to the embodiments set forth herein. It is to be understood that the same reference numbers may indicate the same components throughout the specification and drawings. In the attached figures, the thickness of layers and regions may be exaggerated for clarity.

It will also be understood that when a layer is referred to as being "on" another layer or substrate, it can be directly on the other layer or substrate, or intervening layers may also be present. In addition, when an element is referred to as being "directly on" another element, there are no intervening elements present.

Hereinafter, embodiments of the present inventive concept will be described with reference to the accompanying drawings.

Figure 1:
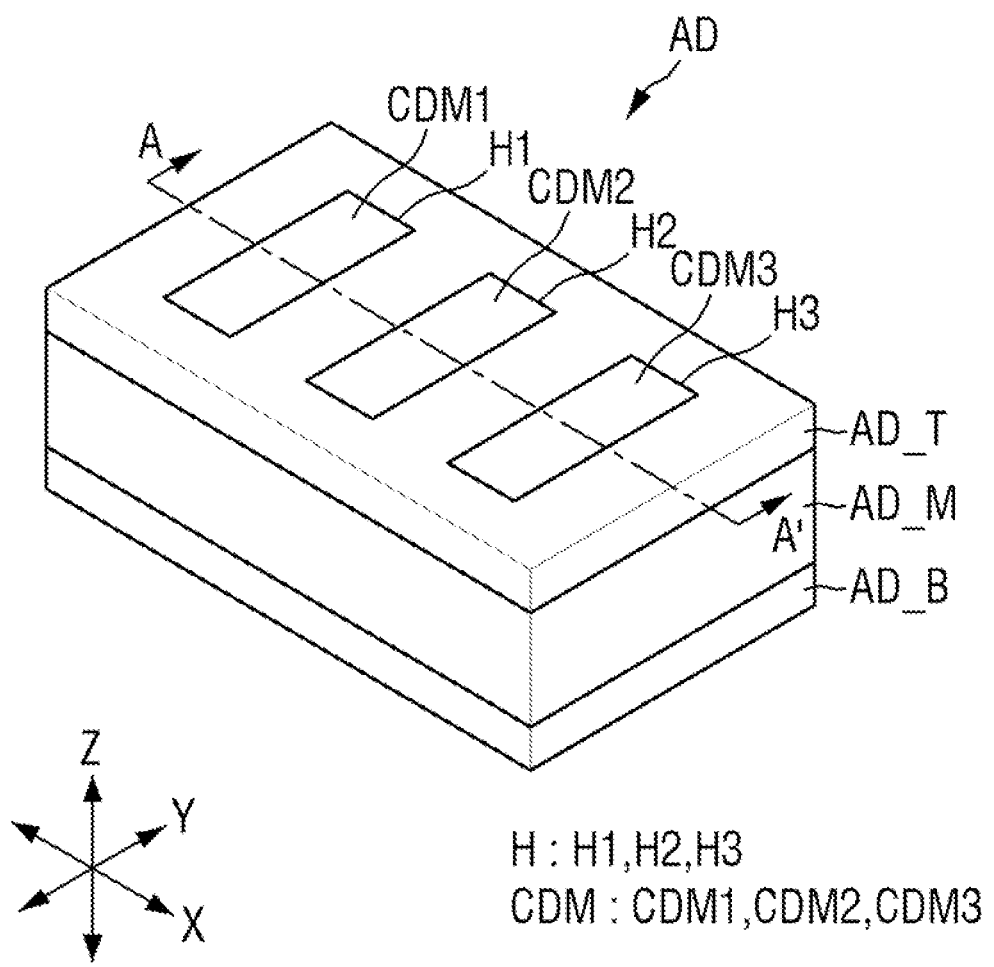
FIG. 1 is a perspective view of an adhesive member according to an embodiment of the present inventive concept.
Figure 2:
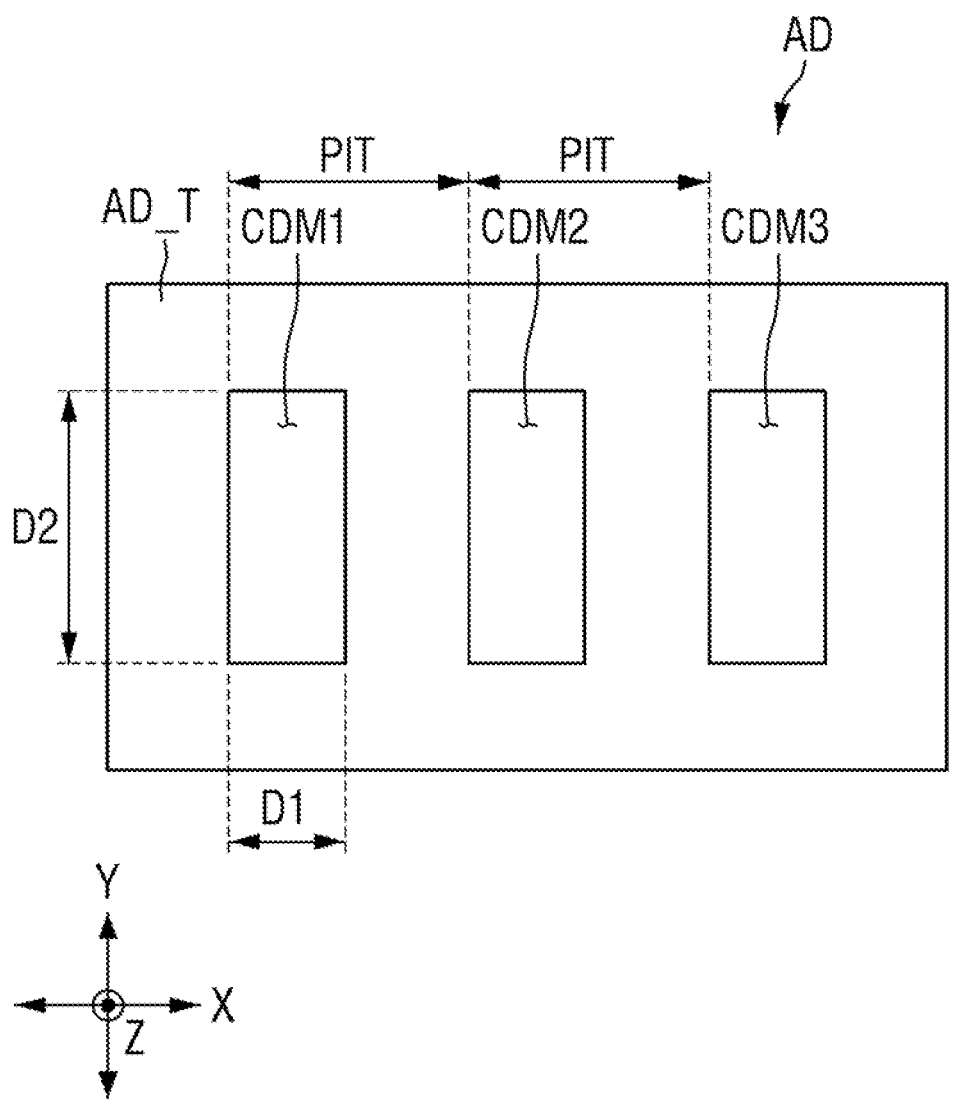
FIG. 2 is a plan view of the adhesive member according to an embodiment of the present inventive concept.

FIG. 1 is a perspective view of an adhesive member according to an embodiment of the present inventive concept FIG. 2 is a plan view of the adhesive member according to an embodiment of the present inventive concept. FIG. 3 is a cross-sectional view taken along line A-A' of FIG. 1.

Hereinafter, a fast direction X, a second direction Y, and a third direction Z intersect each other and extend in different directions. In an embodiment of the present inventive concept, the first direction X, the second direction Y, and the third direction Z may intersect each other perpendicularly. For example, the first direction X may be a transverse direction. For example, the second direction Y may be a longitudinal direction, and the third direction Z may be a thickness direction. For example, the first direction X, the second direction Y, and/or the third direction Z may each include two or more directions. For example, the third direction Z may include an upward direction and a downward direction. In this case, one surface of a member disposed to face in the upward direction may be referred to as an upper surface, and an opposing surface of the member disposed to face in the downward direction may be referred to as a lower surface. However, the directions are merely examples and the present inventive concept is not limited thereto.

Referring to FIGS. 1 to 3, an adhesive member AD may include, for example, a conductive member that is interposed between different components and electrically interconnects the components. In one embodiment of the present inventive concept, the adhesive member AD may be the adhesive member AD for a display device, but the present inventive concept is not limited thereto.

In one embodiment of the present inventive concept, the adhesive member AD may have a rectangular parallelepiped shape elongated in the first direction X, but the present inventive concept is not limited thereto. In an embodiment of the present inventive concept, the adhesive member AD may be formed of a film-type member having a relatively small thickness.

The adhesive member AD may include a base layer AD_M, a first adhesive layer AD_T, a second adhesive layer AD_B, and a plurality of conductive members CDM.

The base layer AD_M may be interposed between the first adhesive layer AD_T and the second adhesive layer AD_B. The base layer AD_M may be made of an insulating material. For example, the base layer AD_M may be made of aluminum oxide. The base layer AD_M may include a plurality of holes H1_M, H2_M, and H3_M. For example, each of the plurality of holes H1_M, H2_M, and H3_M of the base layer may include pores. In one embodiment of the present inventive concept, the base layer AD_M may be an anodic aluminum oxide template including a plurality of fine pores that are formed by anodizing aluminum.

The first adhesive layer AD_T and the second adhesive layer AD_B may be disposed on a first surface and a second surface of the base layer AD_M, respectively, and the second surface is a surface opposite to the first surface. The first surface of the base layer AD_M may be an upper surface of the base layer AD_M, and the second surface of the base layer AD_M may be a lower surface of the base layer AD_M. For example, the first adhesive layer AD_T and the second adhesive layer AD_B may be in direct contact with the first surface and the second surface of the base layer AD_M, respectively, and the second surface is surface opposite to the first surface.

The first adhesive layer AD_T and the second adhesive layer AD_B may each include a thermoplastic material, such as styrene butadiene, polyvinyl butylene, or the like, or a thermosetting material, such as an epoxy resin, a polyurethane, an acrylic resin, or the like.

The first adhesive layer AD_T and the second adhesive layer AD_B may each include an ultraviolet curing resin or a low-temperature curing resin. The ultraviolet curing resin may include at least one among a photopolymerizable monomer, a photopolymerizable polymer and/or a photoinitiator. For example, the ultraviolet curing resin may include at least one among an acrylic-based resin, an unsaturated polyester resin, a polyester acrylate resin, a polyurethane acrylate resin, a polyimide-based resin, and/or an epoxy acrylate resin. The low-temperature curing resin may refer to a resin cured at about 130° C. or less. For example, the low-temperature curing resin may include at least one among an epoxy-based resin, a polyimide-based resin, a phenolic resin, a melamine-based resin, a urea resin, an unsaturated polyester-based resin, an alkyd resin, and/or a polyurethane resin.

The first adhesive layer AD_T and the second adhesive layer AD_B may have different adhesions for the same object to be adhered. For example, the first adhesive layer AD_T may have a greater adhesion to polyimide than the second adhesive layer AD_B, and the first adhesive layer AD_T may have a smaller adhesion to glass than the second adhesive layer AD_B. In one embodiment of the present inventive concept, the first adhesive layer AD_T may be made of an acrylic-based resin having an excellent adhesion to polyimide, and the second adhesive layer AD_B may be made of an epoxy-based resin having an excellent adhesion to glass but the present inventive concept is not limited thereto.

The first adhesive layer AD_T and the second adhesive layer AD_B may include a plurality of holes H1_T, H2_T, and H3_T, and a plurality of holes H1_B, H2_B, and H3_B, respectively. The plurality of holes H1_T, H2_T, and H3_T of the first adhesive layer AD_T, the plurality of holes H1_M, H2_M, and H3_M of the base layer AD_M, and the plurality of holes H1_B, H2_B, and H3_B of the second adhesive layer AD_B may be disposed to overlap each other in the thickness direction and may be connected with each other. For example, the plurality of holes H1_T, H2_T, and H3_T of the first adhesive layer AD_T, the plurality of holes H1_M, H2_M, and H3_M of the base layer AD_M, and the plurality of holes H1_B, H2_B, and H3_B of the second adhesive layer AD_B may be aligned with each other. For example, the first adhesive layer AD_T and the second adhesive layer AD_B may be applied to remaining areas of the upper surface and the lower surface of the base layer AD_M so that the plurality of holes H1_M, H2_M, and H3_M of the base layer AD_M are not covered. The remaining areas may be areas in which openings of the plurality of holes H1_M, H2_M, and H3_M of the base layer AD_M are not formed. In this case, the plurality of holes H1_T, H2_T, and H3_T of the first adhesive layer AD_T, the plurality of holes H1_M, H2_M, and H3_M of the base layer AD_M and the plurality of holes H1_B, H2_B, and H3_B of the second adhesive layer AD_B may form a plurality of through holes H which pass through the adhesive member AD in the thickness direction.

The plurality of through holes H may pass through the base layer AD_M, the first adhesive layer AD_T, and the second adhesive layer AD_B in the thickness direction. For example, the plurality of through holes H may have a depth D3 of about 5 nm to about 20 nm in the thickness direction.

The plurality of through holes H may include the plurality of holes H1_T, H2_T, and H3_T of the first adhesive layer AD_T, the plurality of holes H1_M, H2_M, and H3_M of the base layer AD_M, and the plurality of holes H1_B, H2_M, and H3_B of the second adhesive layer AD_B. In FIGS. 1 to 3, three through holes H are illustrated, but the number of the plurality of through holes H is not limited thereto. The plurality of through holes H may accommodate the plurality of conductive members CDM therein, respectively, which will be described later.

For example, the plurality of through holes H may each have a rectangular parallelepiped shape. In an embodiment of the present inventive concept, the plurality of through holes H may each have various shapes such as a cylindrical shape, a triangular column shape, and a polygonal column shape. The plurality of through holes H may each have a rectangular shape in a plan view. In an embodiment of the present inventive concept, the plurality of through holes H may each have a circular shape, an elliptical shape, or a polygonal shape in a plan view.

The plurality of through holes H may be arranged to form a row in the first direction X in a plan view. In an embodiment of the present inventive concept, the plurality of through holes H may be arranged to form a column in the second direction Y in a plan view. In an embodiment of the present inventive concept, the plurality of through holes H may be arranged in a matrix form. In an embodiment of the present inventive concept, the plurality of through holes H may be formed to be inclined with respect to the thickness direction. For example, the plurality of through hole H may be tilted between an upper surface and a lower surface of the adhesive member AD.

For example, the plurality of through holes H may be rectangular slits, each of which is elongated in the second direction Y in a plan view. Each through hole H may include two short sides in the first direction X and two long sides in the second direction Y. For example, in a plan view a width D1 in the first direction X of each of the plurality of through holes H may be about 15 nm to about 25 nm, and a width (or, e.g., a length) D2 in the second direction Y thereof may be about 600 nm to about 800 nm. In one embodiment of the present inventive concept, the plurality of through boles H have the same shape and size as one another, but the present inventive concept is not limited thereto. In an embodiment of the present inventive concept, the plurality of through holes H may have different shapes and sizes from one another.

Hereinafter, for convenience of description, the plurality of through holes H illustrated in FIGS. 1 to 3 are referred to as a first through hole H1, a second through hole H2, and a third through hole H3, respectively, in order from the left.

The plurality of through holes H may be arranged to be spaced apart from each other in a plan view. In one embodiment of the present inventive concept, the plurality of through holes H may be arranged in the first direction X such that the plurality of through holes H have a constant pitch PIT. The pitch PIT may be a distance from one side of one through hole H to one side of another adjacent through hole H. For example, as shown in FIG. 2, the pitch PIT may be a distance from a left side of the first through hole H1 to a left side of the adjacent second through hole H2, but the present inventive concept is not limited thereto. The criterion of the pitch PIT may be a distance between centers or left sides of adjacent through holes H.

The plurality of through holes H may be disposed to be spaced apart at predetermined intervals. For example, as shown in FIG. 2, an interval in the first direction X between the first through hole H1 and the second through hole H2 may be substantially equal to an interval in the first direction X between the second through hole H2 and the third through hole H3.

The plurality of through holes H may be arranged to have the pitch PIT which is identical to a pitch PIT of pads and/or electrodes mounted on an object to be adhered. For example, the pitch PIT may be about 15 nm to about 25 nm. In an embodiment of the present inventive concept, the plurality of through holes H be disposed to be spaced apart from each other at different intervals in a plan view.

The plurality of through holes H may each include one side opening formed on one surface (e.g., a first surface) of the adhesive member AD and the other side opening formed on the other surface (e.g., the second or the opposing surface) of the adhesive member AD. In one embodiment of the present inventive concept, a width of the one side opening may be equal to a width of the other side opening, but the present inventive concept is not limited thereto.

The plurality of conductive members CDM may be disposed in the plurality of through holes H, respectively. The plurality of conductive members CDM may be inserted into the plurality of through holes H, respectively, to fill at least a portion of each of the plurality of through holes H. For example, the plurality of conductive members CDM may be in direct contact with at least one of the base layer AD_M the first adhesive layer AD_T, and the second adhesive layer AD_B. In FIGS. 1 to 3, it is illustrated that a first conductive member CDM1, a second conductive member CDM2, and a third conductive member CDM3 are disposed in the first through hole H1, the second through hole H2, and the third through hole H3, respectively, and each of the first conductive member CDM1, the second conductive member CDM2, and the third conductive member CDM3 is in direct contact with the base layer AD_M, the first adhesive layer AD_T, and the second adhesive layer AD_B, but the present inventive concept is not limited thereto.

The plurality of conductive members CDM may each have a shape corresponding to the shape of its respective through hole H of the plurality of through holes H. In one embodiment of the present inventive concept, each of the plurality of conductive members CDM may be formed as a member having a rectangular parallelepiped shape that fills an interior of each of the plurality of through holds H, but the present inventive concept is not limited thereto.

Each of the plurality of conductive members CDM may include an insulating adhesive material and fine conductive particles sprayed on the insulating adhesive material. When the plurality of conductive members CDM are pressed in the thickness direction, resistance in the thickness direction may be varied. For example, when the plurality of conductive members CDM are pressed in the thickness direction, the plurality of conductive members CDM may have conductivity in the thickness direction and insulation in a direction intersecting the thickness direction. In one embodiment of the present inventive concept, the conductive particles may each be, for example, a conductive ball having a fine size of 3 μm to about 15 μm in diameter and containing a metallic material such as gold (Au), nickel (Ni), and/or palladium (Pd), and polymer particles coated thereon. In an embodiment of the present inventive concept, the plurality of conductive members CDM may be made of only metal.

Figure 4:
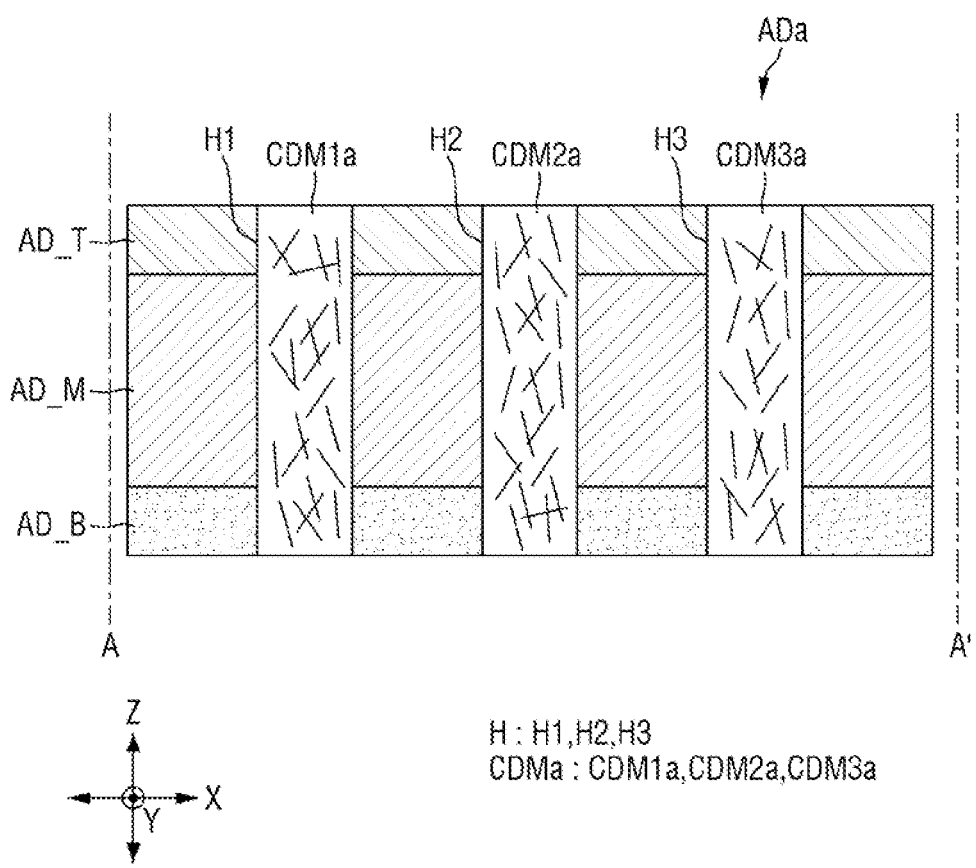
FIG. 4 is a cross-sectional view of an adhesive member according to an embodiment of the present inventive concept.
Figure 5:
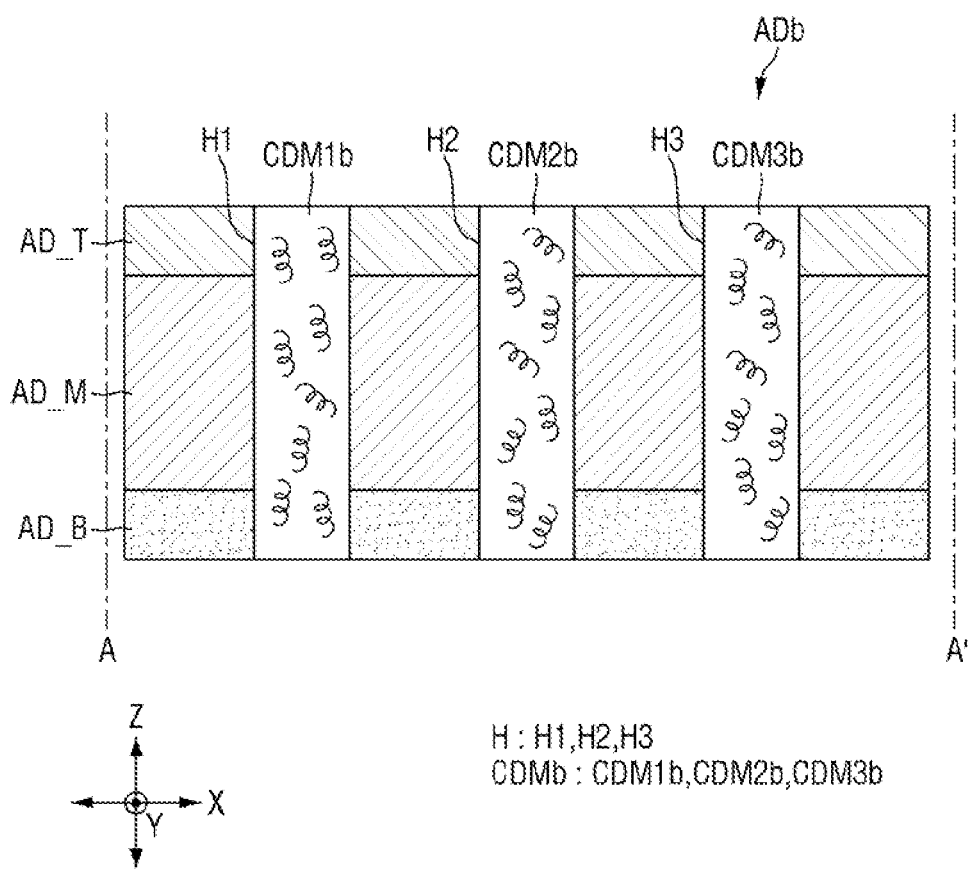
FIG. 5 is a cross-sectional view of an adhesive member according to an embodiment of the present inventive concept.

FIG. 4 is a cross-sectional view of an adhesive member according to an embodiment of the present inventive concept. FIG. 5 is a cross-sectional view of an adhesive member according to an embodiment of the present inventive concept.

In the embodiments of FIGS. 4 and 5, conductive particles of a plurality of conductive members CDMa and a plurality of conductive members CDMb are different from those of the embodiment of FIGS. 1 to 3. In addition, the embodiments of FIGS. 4 and 5 are substantially the same as or similar to the embodiment of FIGS. 1 to 3 except for the conductive particles of the plurality of conductive members CDMa and CDMb, and thus in the following, redundant descriptions may be omitted.

Referring to FIG. 4, the conductive particles of the plurality of conductive members CDMa may be nanowires. Each of the nanowires may be formed of a metal such as Au, Ni, and/or Pd, and may be a rod-shaped wire structure having a size of a nanometer unit.

Referring to FIG. 5, the conductive particles of the plurality of conductive members CDMb may be nanosprings. For example, the nanosprings may each have a shape in which a nanowire is spirally bent. The conductive members CDMb including the nanosprings may be more easily deformed than the conductive members CDM of FIGS. 1 to 3 or the conductive members CDMa of FIG. 4, thereby facilitating the bonding of an adhesive member ADb and preventing deformation and breakage of the members which may occur in the process.

Figure 6:
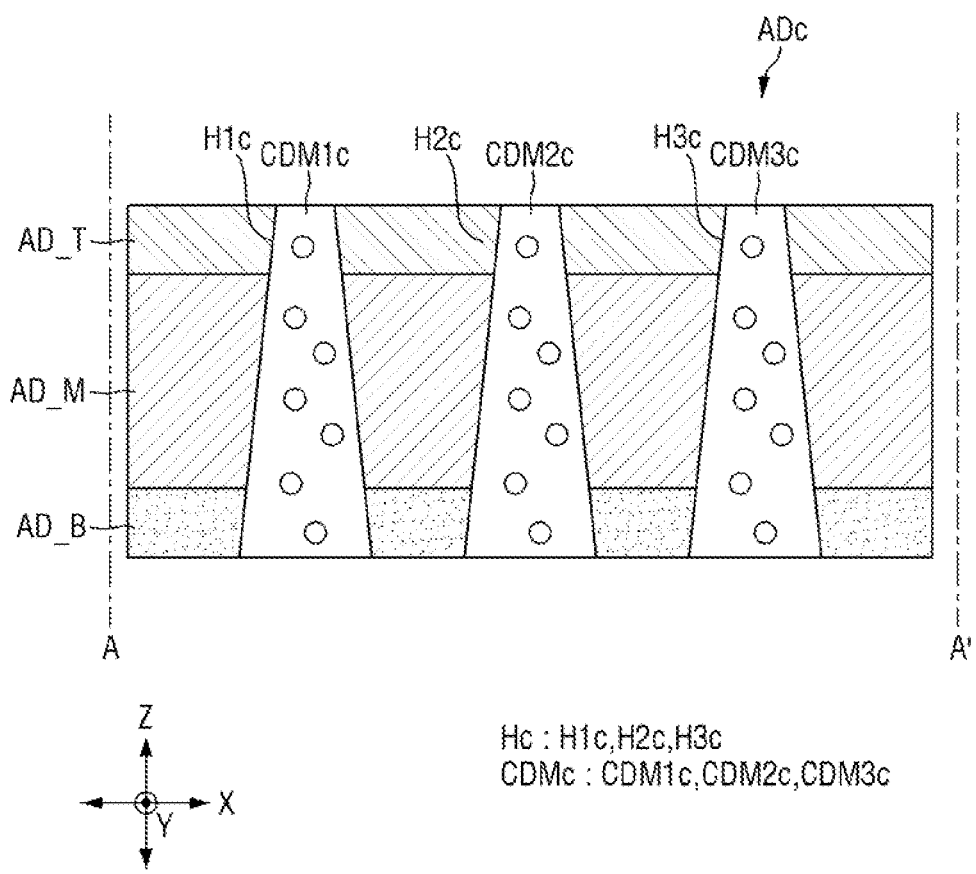
FIG. 6 is a cross-sectional view of an adhesive member according to an embodiment of the present inventive concept.

FIG. 6 is a cross-sectional view of an adhesive member according to an embodiment of the present inventive concept.

In the embodiment of FIG. 6, a shape of each of a plurality of through holes Hc and a plurality of conductive members CDMc is different from that of the embodiment of FIGS. 1 to 3. In addition, the embodiment of FIG. 6 is substantially the same as or similar to the embodiment of FIGS. 1 to 3 except for the shapes of the plurality of through holes Hc and the plurality of conductive members CDMc, and thus in the following, redundant descriptions may be omitted.

Referring to FIGS. 2 and 6, a width of each of the plurality of through holes Hc may vary as each of the plurality of through holes Hc extends in the thickness direction. The width may be a width D1 in the first direction X and/or a width D2 in the second direction Y. In an embodiment of the present inventive concept, the width may be a diameter. As shown in FIG. 6, the plurality of through holes Hc may each have a tapered shape so that the width of each of the plurality of through holes Hc increases toward a lower surface of an adhesive member ADc; however, the present inventive concept is not limited thereto. Accordingly, a width in the first direction X and/or a width in the second direction Y of the plurality of conductive members CDMc may also increase toward the lower surface of the adhesive member ADc to correspond to the width D1 in the first direction X and/or the width D2 in the second direction Y of each of the plurality of through holes Hc. However, the present inventive concept is not limited thereto. In an embodiment of the present inventive concept, the widths of the plurality of through holes Hc may increase in the upward direction.

One side opening and the other side opening (e.g., an opposing side opening) of each of the plurality of through holes Hc may have different sizes from each other. The one side opening may be formed on one surface of the adhesive member ADc, and the other side opening may be formed on the other surface of the adhesive member ADc. As shown in FIG. 6, a width of the one side opening may be less than that of the other side opening. In an embodiment of the present inventive concept, the width of the one side opening may be greater than that of the other side opening.

Figure 7:
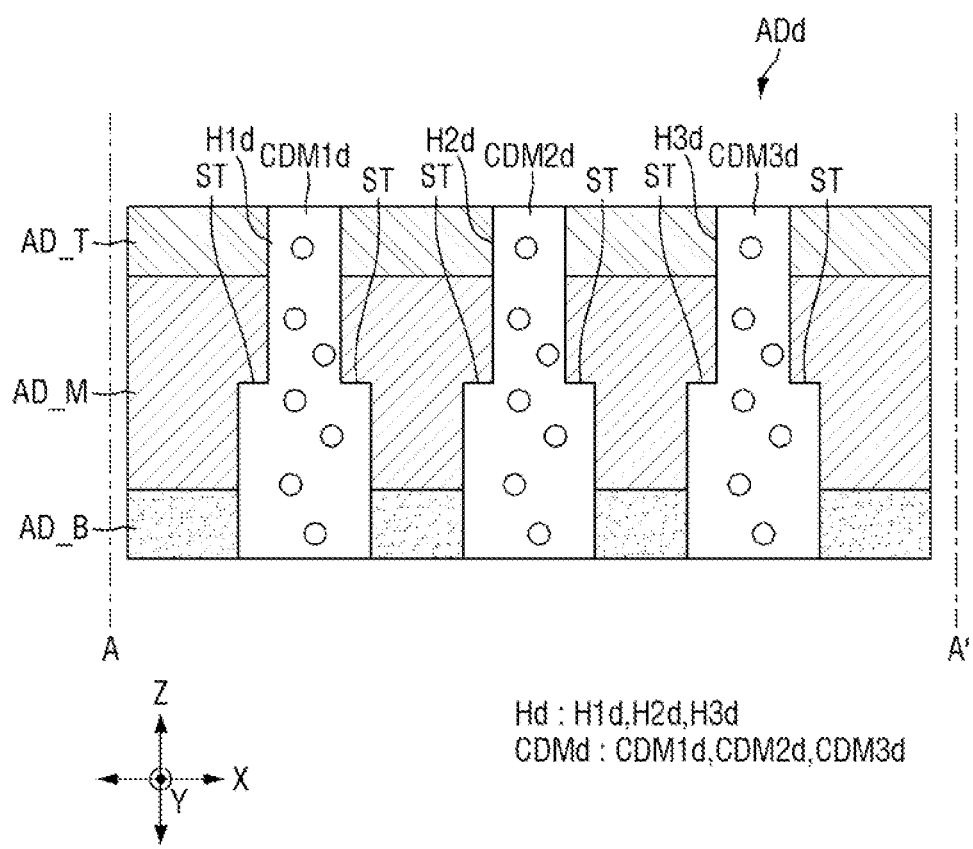
FIG. 7 is a cross-sectional view of an adhesive member according to an embodiment of the present inventive concept.

FIG. 7 is a cross-sectional view of an adhesive member according to an embodiment of the present inventive concept.

The embodiment of FIG. 7 is different from the embodiment of FIG. 6 in that a plurality of through holes Hd are formed to each have a step ST. In addition, the embodiment of FIG. 7 is substantially the same as or similar to the embodiment of FIG. 6 except that the plurality of through holes Hd are formed to each have the step ST, and thus in the following, redundant descriptions may be omitted.

Referring to FIG. 7, a width of each of the plurality of through holes Hd may change as each of the plurality of through holes Hd extends in the thickness direction. In each of the plurality of through holes Hd, a width of one side opening formed on one surface of an adhesive member ADd may be greater than a width of the other side opening formed on the other surface of the adhesive member ADd. In this case, unlike the embodiment of FIG. 6, the plurality of through holes Hd may each have the step ST in a cross-sectional view. For example, a cross section of a base layer AD_M, through which the plurality of through holes Hd extend, may have the step ST. Accordingly, a conductive member CDMd inserted into each of the plurality of through holes Hd may also have a shape corresponding to a shape of the step ST of each of the plurality of through holes Hd. In one embodiment of the present inventive concept, the step ST of each of the plurality of through holes Hd is formed to have a right angle, but the shape of the step ST is not limited thereto. In an embodiment of the present inventive concept, the step ST of each of the plurality of through holes Hd may be formed to have a curvature.

Figure 8:
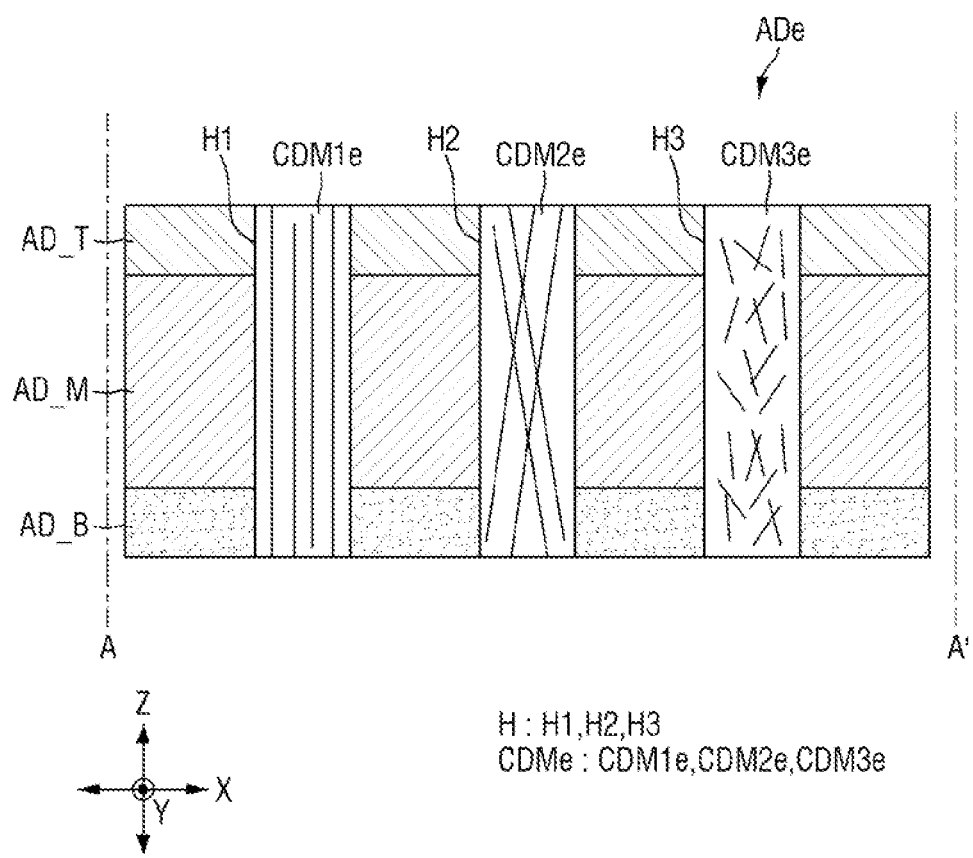
FIG. 8 is a cross-sectional view of an adhesive member according to an embodiment of the present inventive concept.

FIG. 8 is a cross-sectional view of an adhesive member according to an embodiment of the present inventive concept.

The embodiment of FIG. 8 is different from the embodiment of FIG. 4 in that conductive members CDMe include nanowires of various lengths. In addition, the embodiment of FIG. 8 is substantially the same as or similar to the embodiment of FIG. 4 except that the lengths of the nanowires, which are applied as the conductive particles of the conductive member CDMe, may be variously changed, and thus in the following, redundant descriptions may be omitted.

Referring to FIG. 8, as described above, the nanowires may be applied as conductive particles of the conductive member CDMe. Unlike in the embodiment of FIG. 4, the lengths of the nanowires may be variously changed.

As shown on the left side of FIG. 8, in the case of a first conductive member CDM1e, long rod-shaped nanowires arranged in a vertical direction may be applied as the conductive particles. In this case, both ends of the nanowire in the first conductive member CDM1e may be positioned at upper and lower portions of a first through hole H1, respectively, or may be disposed to be in contact with one surface and/or the other surface of an adhesive member ADe, respectively. For example, the nanowire may have a length in the thickness direction, which is greater than or equal to a thickness of a base layer AD_M. In another example, the length in the third direction of the nanowire may be substantially the same as or similar to a thickness of the adhesive member ADe.

As shown in the center of FIG. 8, in the case of a second conductive member CDM2e, long rod-shaped nanowires extending diagonally or at a tilt may be applied as the conductive particles. Similar to the first conductive member CDM1e, both ends of the nanowire in the second conductive member CDM2e may be positioned at upper and lower portions of a second through hole H2, respectively, or may be disposed to be in contact with one surface and/or the other surface of the adhesive member ADe, respectively.

As shown in the right side of FIG. 8, in the case of a third conductive member CDM3e, nanowires each having a length less than that of the first conductive member CDM1e and the second conductive member CDM2e may be applied as the conductive particles. For example, the length of each of the nanowires of the third conductive member CDM3e may be less than a thickness of each of a first adhesive layer AD_T, the base layer AD_M, and/or a second adhesive layer AD_B. However, the present inventive concept is not limited thereto.

In FIG. 8, it is illustrated that the nanowires having a different structure from each other are applied as the conductive particles of each of the first conductive member CDM1e, the second conductive member CDM2e, and the third conductive member CDM3e, but the present inventive concept is not limited thereto. In an embodiment of the present inventive concept, nanowires having the same structure may be applied to each of the first conductive member CDM1e, the second conductive member CDM2e, and the third conductive member CDM1e. For example, the long rod-shaped nanowires arranged in the vertical direction, the long rod-shaped nanowires extending diagonally, and/or the short nanowires may be applied to each of the first conductive member CDM1e, the second conductive member CDM2e, and the third conductive member CDM3e.

Figure 9:
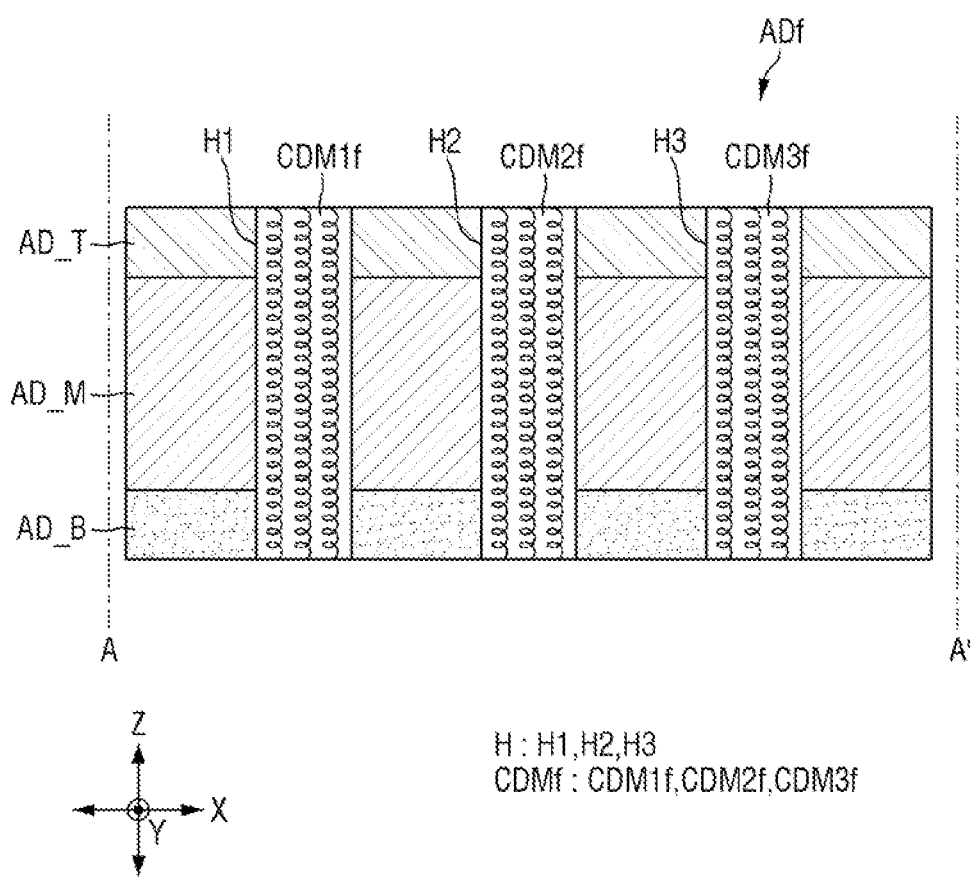
FIG. 9 is a cross-sectional view of an adhesive member according to an embodiment of the present inventive concept.

FIG. 9 is a cross-sectional view of an adhesive member according to an embodiment of the present inventive concept.

In the embodiment of FIG. 9, a length of each of nanosprings applied as conductive particles of a conductive member CDMf is different from that of the embodiment of FIG. 5. In addition, the embodiment of FIG. 9 is substantially the same as or similar to the embodiment of FIG. 5 except for the lengths of the nanosprings applied as the conductive particles of the conductive member CDMf, and thus in the following, redundant descriptions will be omitted.

Referring to FIG. 9, as described above, the nanosprings may be applied as the conductive particles of the conductive member CDMf. Unlike the embodiment of FIG. 5, each of the nanosprings is elongated in the thickness direction so that both ends thereof may be disposed adjacent to one surface and the other surface of an adhesive member ADf, respectively. For example, the nanospring may have a length in the thickness direction, which is greater than or equal to the thickness of a base layer AD_M. In another example, the length, in the thickness direction, of the nanospring may be substantially the same as or similar to the thickness of the adhesive member ADf. For example, both ends of the nanospring may be in contact with one surface and the other surface of the adhesive member ADf, respectively. In an embodiment of the present inventive concept, similar to the embodiment of FIG. 9, a first conductive member CDM1f, a second conductive member CDM2f, and a third conductive member CDM3f may include various lengths of nanosprings. In an embodiment of the present inventive concept, the nanosprings of the first conductive member CDM1f, the nanosprings of the second conductive member CDM2f, and the nanosprings of the third conductive member CDM3f may be different from one another.

Figure 10:
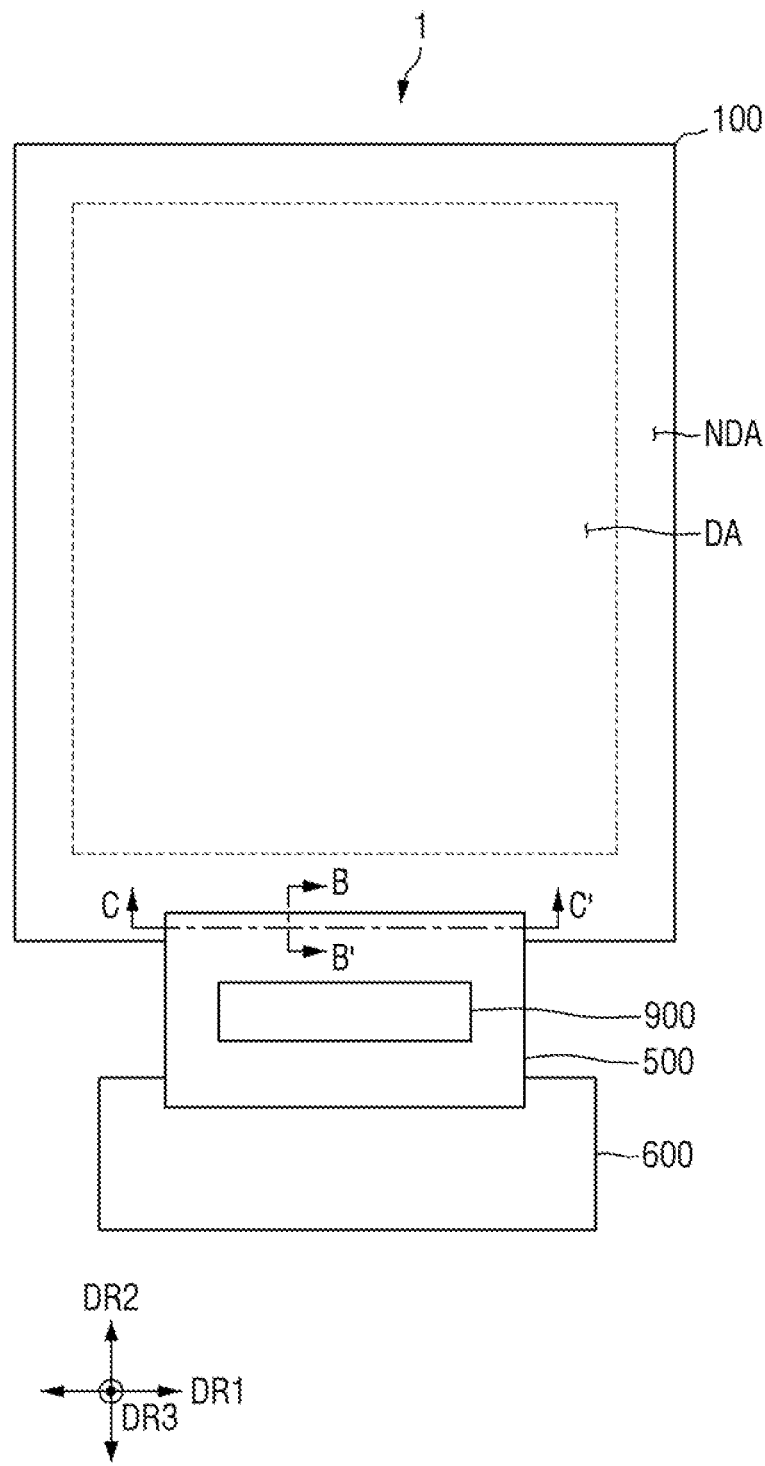
FIG. 10 is a plan view of a display device according to an embodiment of the present inventive concept.
Figure 11:
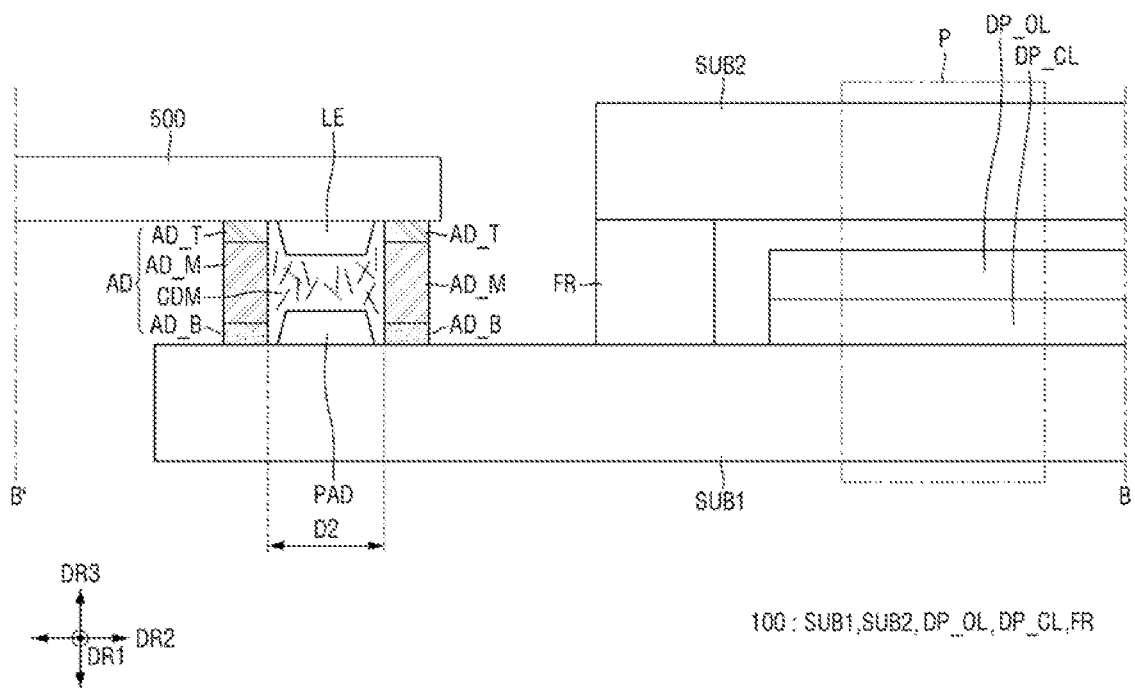
FIG. 11 is a cross-sectional view taken along line B-B' of FIG. 10.

FIG. 10 is a plan view of a display device according to one embodiment of the present inventive concept. FIG. 11 is a cross-sectional view taken along line B-B' of FIG. 10. FIG.

Figure 13:
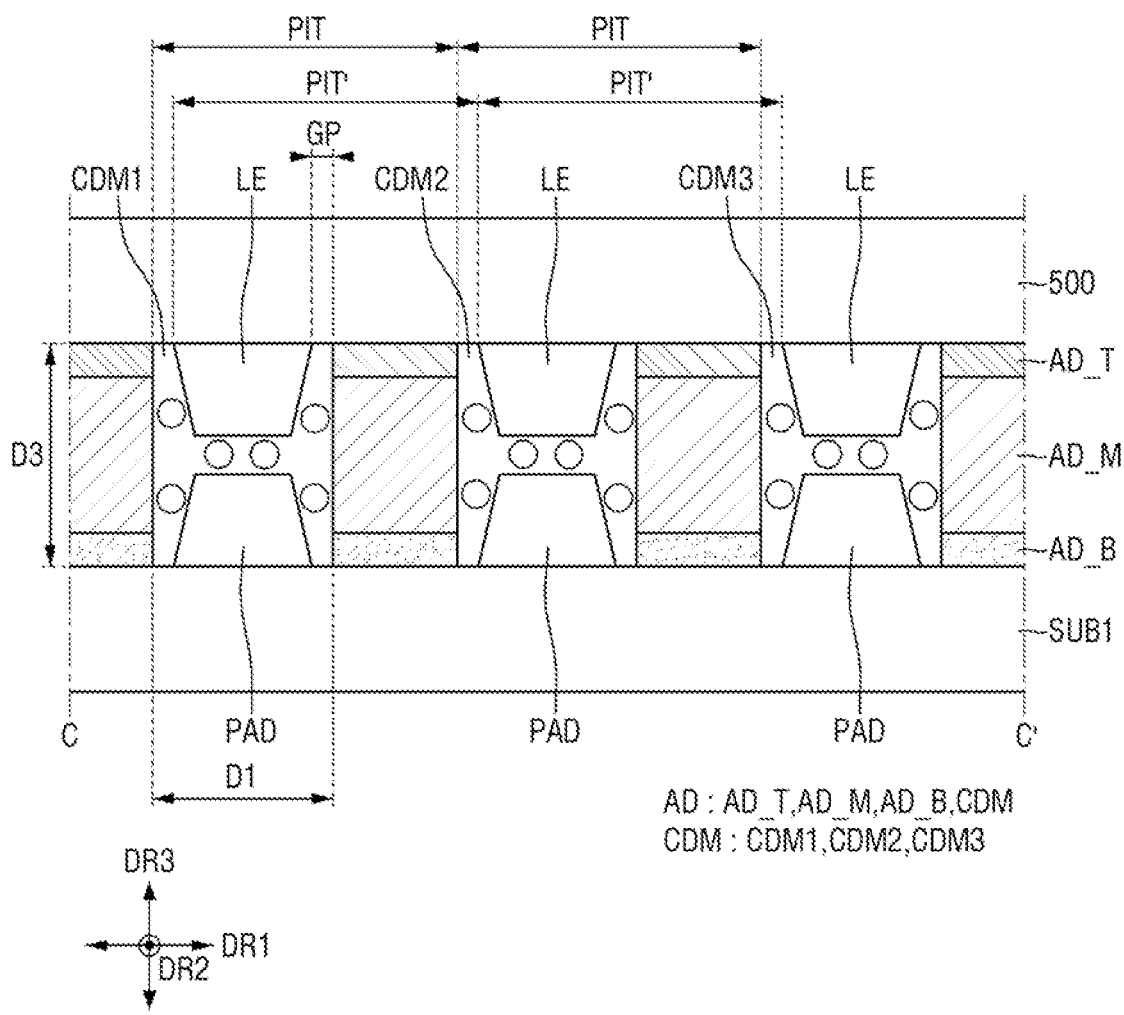
FIG. 13 is a cross-sectional view taken along line C-C" of FIG. 10.

12 is an enlarged cross-sectional view of portion P of FIG. 11. FIG. 13 is a cross-sectional view taken along line C-C' of FIG. 10.

Hereinafter, a display device 1 including an adhesive member AD will be described. The adhesive member AD may be the adhesive member AD of FIG. 1.

Hereinafter, a first direction DR1, a second direction DR2, and a third direction DR3 intersect in different directions. In one embodiment of the present inventive concept, the first direction DR1, the second direction DR2, and the third direction DR3 may intersect substantially perpendicularly. For example, the first direction DR1 may be a transverse direction, the second direction DR2 may be a longitudinal direction, and the third direction DR3 may be a thickness direction. The first direction DR1, the second direction DR2, and or the third direction DR3 may each include two or more directions. For example, the third direction DR3 may include an upward direction and a downward direction. In this case, one surface of a member disposed to face in the upward direction may be referred to as an upper surface, and the other surface of the member disposed to face in the downward direction may be referred to as a lower surface. The first direction DR1, the second direction DR2, and the third direction DR3 may be substantially the same as or different from the first direction X, the second direction Y, and the third direction Z of FIGS. 1 to 9, respectively. However, the directions are merely an example, and the following embodiments are not limited to the above described description.

The display device 1 is a device for displaying, for example, a video or a still image. The display device 1 may include various kinds of products such as a television, a notebook computer, a monitor, digital signage, and an Internet of Things device, as well as portable electronic devices such as a mobile phone, a smartphone, a tablet personal computer (PC), a smart watch, a watch phone, a mobile communication terminal, an electronic notebook, e-book reader, a portable multimedia player (PMP), a navigation device, and an ultra-mobile PC (UMPC).

Referring to FIG. 10, the display device 1 may include a display panel 100 configured to display an image, a printed circuit board 500 connected to the display panel 100, a main circuit board 600 connected to the printed circuit board 500, and a driving integrated circuit 900 mounted on the printed circuit board 500.

The display panel 100 may be, for example, an organic light-emitting display panel. In the following embodiments of the present inventive concept, an example in which an organic light-emitting display panel is applied as the display panel 100 is illustrated, but the present inventive concept is not limited thereto, and other types of display panels, such as a liquid crystal display (LCD), a quantum dot organic light-emitting display panel (QD-OLED), a quantum dot LCD (QD-LCD), a quantum nano light-emitting display panel (a nano-emissive display (NED)), a micro LED, and the like may be applied as the display panel 100.

The display panel 100 includes a display area DA, which includes a plurality of pixel areas, and a non-display area NA disposed around the display area DA.

The display area DA may have a polygonal shape, for example, a rectangular shape of which a corner has a right angle in a plan view or a rectangular shape of which a corner is round in a plan view. The display area DA may have short sides and long sides. The short sides of the display area DA may be sides which extend in the first direction DR1. The long sides of the display area DA may be sides which extend in the second direction DR2. However, a planar shape of the display area DA is not limited to the rectangular shape, and the display area DA may have various shapes such as a circular shape, an elliptical shape, or the like. The non-display area NA may be disposed adjacent to both short sides and both long sides of the display area DA. For example, the non-display area NA may surround all sides of the display area DA and configure an edge of the display area DA. However, the non-display area NA is not limited thereto and, for example, may be disposed adjacent to only both short sides or only both long sides of the display area DA. In an embodiment of the present inventive concept, in the display panel 100, both corner portions adjacent to a portion to which the printed circuit board 500 is connected may be cut in an shape so that a width in the first direction of the portion to which the printed circuit board 500 is connected is reduced.

The printed circuit board 500 may be attached to the non-display area NA at a lower end of the display panel 100. One side of the printed circuit board 500 may be attached to the display panel 100, and the other side of the printed circuit board 500 may be attached to the main circuit board 600. The printed circuit board 500 may electrically connect the display panel 100 and the main circuit board 600 to each other. In an embodiment of the present inventive concept, the printed circuit board 500 may be bent in the thickness direction such that a portion thereof overlaps the display panel 100.

The main circuit board 600 may be attached to the printed circuit board 500. The main circuit board 600 may include a circuit pad area electrically connected to the printed circuit board 500.

The driving integrated circuit 900 is mounted on the printed circuit board 500 and drives a pixel circuit of the display panel 100. The one side may be a lower side of the display panel 100, which extends in the first direction DR1. The driving integrated circuit 900 may be, for example, a chip-on-film (COF). In an embodiment of the present inventive concept, the driving integrated circuit 900 may be a chip-on-plastic (COP) or a chip-on-glass (COG).

With further reference to FIG. 11, the display panel 100 may include a first substrate SUB1, a circuit element layer DP_CL formed on the first substrate SUB1, a display element layer DP_OL formed on the circuit element layer DP_CL, a second substrate SUB2 formed on the display element layer DP_OL, and a sealing member FR. The display panel 100 may further include, for example, functional layers such as a touch layer, an anti-reflection layer, a refractive index adjusting layer, and the like. In an embodiment of the present inventive concept, the second substrate SUB2 may be omitted, and the display panel 100 may further include a thin film encapsulation layer configured to encapsulate the circuit element layer DP_CL and the display element layer DP_OL. In this case, the sealing member FR may also be omitted.

The first substrate SUB1 and the second substrate SUB2 are disposed to face each other. The circuit element layer DP_CL and the display element layer DP_OL may be interposed between the first substrate SUB1 and the second substrate SUB2. For example, the first substrate SUB1 and the second substrate SUB2 may be rigid substrates including a rigid material such as flexible glass, quartz, or the like. However, the fast substrate SUB1 and the second substrate SUB2 are not limited thereto and may be flexible substrates including a flexible material such as polyimide (PI).

The circuit element layer DP_CL includes at least one intermediate insulating layer and a circuit element. The circuit element layer DP_CL may include a thin film transistor.

The display element layer DP_OL includes a self-emissive element. For example, the self-emissive element may be an organic light-emitting element.

The circuit element layer DP_CL and the display element layer DP_OL may be sealed by the sealing member FR disposed at edges of the first substrate SUB1 and the second substrate SUB2 to block a gap between the first substrate SUB1 and the second substrate SUB2.

In one embodiment of the present inventive concept, the circuit element layer DP_CL and the display element layer DP_OL may be aligned such that edges thereof overlap each other in the thickness direction. However, the present inventive concept is not limited thereto. In an embodiment of the present inventive concept, the circuit element layer DP_CL and the display element layer DP_OL may be disposed such that the edge of the circuit element layer DP_CL protrudes further outward than the edge of the display element layer DP_OL.

Figure 12:
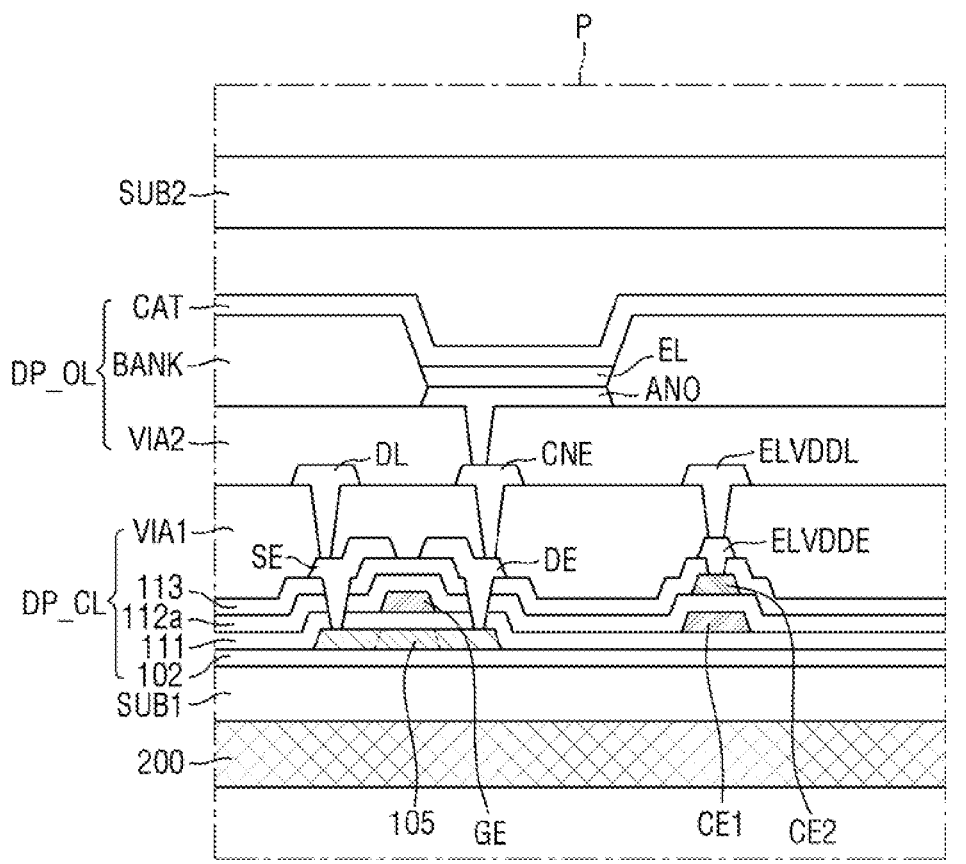
FIG. 12 is an enlarged cross-sectional view of portion P of FIG. 11.

With further reference to FIG. 12, the circuit element layer DP_CL may include a buffer layer 102, a semiconductor layer 105, a first insulating layer 111, a first conductive layer 120, a second insulating layer 112a, a second conductive layer 130, a third insulating layer 113, a third conductive layer 140, a first via layer VIA1 and a fourth conductive layer 150. The display element layer DP_OL may include a second via layer VIA2, an anode ANO, a bank layer BANK, an organic layer EL, and a cathode CAT.

The buffer layer 102 may be disposed on the first substrate SUB1. The buffer layer 102 may prevent moisture and oxygen from penetrating from the outside through the first substrate SUB1. The buffer layer 102 may include at least one of a silicon nitride (SiN$_x$) film, a silicon oxide (SiO$_2$) film, and/or an oxynitride (SiO$_x$N$_y$) film.

The semiconductor layer 105 may be disposed on the buffer layer 102. The semiconductor layer 105 forms a channel of a thin film transistor. The semiconductor layer 105 may be disposed in each pixel of the display area DA. In an embodiment of the present inventive concept, the semiconductor layer 105 may be disposed in the display area DA and the non-display area NA. The semiconductor layer 105 may include a source/drain area and an active area. The semiconductor layer 105 may include, for example, polycrystalline silicon.

The first insulating layer 111 may be disposed on the semiconductor layer 105. For example, the first insulating layer 111 may be disposed over an entire surface of the first substrate SUB1. The first insulating layer 111 may be a gate insulating film having a gate insulating function. For example, the first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. The above materials may be used alone or in combinations thereof.

The first conductive layer 120 may be disposed on the first insulating layer 111. The first conductive layer 120 may include a gate electrode GE of a thin film transistor TFT, a first electrode CE1 of a storage capacitor, and a gate signal line.

The first conductive layer 120 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu). The first conductive layer 120 may be a single film or a stacked film made of a material selected from the above-exemplified materials.

The second insulating layer 112a may be disposed on the first conductive layer 120. The second insulating layer 112a may insulate the first conductive layer 120 and the second conductive layer 130 from each other. The second insulating layer 112a may be made of a material selected from the above-exemplified materials of the first insulating layer 111.

The second conductive layer 130 may be disposed on the second insulating layer 112a. The second conductive layer 130 may include a second electrode CE2 of the storage capacitor. A material of the second conductive layer 130 may be selected from the above-exemplified materials of the first conductive layer 120. The first electrode CE1 and the second electrode CE2 may form the storage capacitor with the second insulating layer 112a disposed therebetween.

The third insulating layer 113 may be disposed on the second conductive layer 130. The third insulating layer 113 may include at least one of the above-exemplified materials of the first insulating layer 111. In an embodiment of the present inventive concept, the third insulating layer 113 may include an organic insulating material. The organic insulating material may be selected from exemplified materials of the first via layer VIA1 that will be described below.

The third conductive layer 140 may be disposed on the third insulating layer 113. The third conductive layer 140 may include a source electrode SE, a drain electrode DE, and a high-potential voltage electrode ELVDDE. The source electrode SE and the drain electrode DE may each be electrically connected to the semiconductor layer 105 through a corresponding contact hole passing through the first insulating layer 111, the second insulating layer 112a, and the third insulating layer 113. The high potential voltage electrode ELVDDE may be electrically connected to the second electrode CE2 through a contact hole passing through the third insulating layer 113. The third conductive layer 140 may include at least one of Mo, Al, Pt, Pd, Ag, Mg, Au, Ni, Nd, Ir, Cr, Ca, Ti, Ta, W, and/or Cu. The third conductive layer 140 may be a singe film made of a material selected from the above-exemplified materials. The third conductive layer 140 is not limited thereto and may be a stacked film. For example, the third conductive layer 140 may be a stacked structure of Mo/Al/Mo, Mo/AlGe/Mo, Ti/Cu, or the like. In one embodiment of the present inventive concept, the third conductive layer 140 may be a stacked structure of Ti/Al/Ti.

The first via layer VIA1 may be disposed on the third conductive layer 140. The first via layer VIA1 may include an organic insulating material. The organic insulating material may include at least one of acrylic-based resin (polyacrylate resin), an epoxy resin, a phenolic resin, a polyamide-based resin, a polyimide-based resin, an unsaturated polyester-based resin, a polyphenylene-based resin, polyphenylenesulfide-based resin, and/or benzocyclobutene (BCB).

The fourth conductive layer 150 may be disposed on the first via layer VIA1. The fourth conductive layer 150 may include a data line DL, a connection electrode CNE, and a high-potential voltage line ELVDDL. The data line DL may be electrically connected to the source electrode SE of the thin film transistor TFT through a contact hole passing through the first via layer VIA1. The connection electrode CNE may be electrically connected to the drain electrode DE of the thin film transistor TFT through a contact hole passing through) the first via layer VIA1. The high-potential voltage line ELVDDL may be electrically connected to the high-potential voltage electrode ELVDDE through a contact hole passing through the first via layer VIA1. The fourth conductive layer 150 may include a material selected from the exemplified materials of the third conductive layer 140.

The second via layer VIA2 may be disposed on the fourth conductive layer 150. The second via layer VIA2 may include at least one of the above-exemplified materials of the first via layer VIA1.

The anode ANO is disposed on the second via layer VIA2. The anode ANO may be electrically connected to the connection electrode CNE through a contact hole passing through the second via layer VIA2.

The bank layer BANK may be disposed on the anode ANO. The bank layer BANK may include a contact hole which exposes the anode ANO. The bank layer BANK may be made of an organic insulating material and/or an inorganic insulating material. For example, the bank layer BANK may include at least one of a photoresist, a polyamide-based resin, an acrylic-based resin, a silicone compound, a polyacrylic-based resin, and/or the like.

The organic layer EL may be disposed on an upper surface of the anode ANO and in an opening of the bank layer BANK. The cathode CAT is disposed on the organic layer EL and the bank layer BANK. The cathode CAT may be a common electrode disposed over a plurality of pixels.

With further reference to FIG. 13, the display panel 100 may further include a plurality of signal lines PAD.

The plurality of signal lines PAD may be disposed in the non-display area and may be disposed on one surface of the first substrate SUB1 which faces the second substrate SUB2. The one surface may be an upper surface of the first substrate SUB1. In one embodiment of the present inventive concept, the plurality of signal lines PAD may be disposed directly on the first substrate SUB1. In an embodiment of the present inventive concept, at least one of the buffer layer 102, the first insulating layer 111, and the second insulating layer 112a may be interposed between the plurality of signal lines PAD and the first substrate SUB1. The plurality of signal lines PAD may be formed on the same layer as any one of the plurality of conductive layers 120, 130, 140, and 150. The plurality of signal lines PAD may be formed simultaneously with any one of the plurality of conductive layers 120, 130, 140, and 150. The plurality of signal lines PAD may be electrically connected to the circuit element layer DP_CL, for example, at least one of the plurality of conductive layers 120, 130, 140, and 150.

The printed circuit board 500 may include a plurality of lead lines LE.

The plurality of lead lines LE may be disposed on one surface of the printed circuit board 500 which faces the first substrate SUB1 of the display panel 100. The one surface may be a lower surface of the printed circuit board 500. For example, the plurality of lead lines LE may be disposed directly on one surface of the printed circuit board 500, which faces the first substrate SUB1 of the display panel 100.

The plurality of signal lines PAD and the plurality of lead lines LE may each include a conductive material. Examples of the conductive material may include one or more of Mo, Al, Pt, Pd, Ag, Mg, Au, Ni, Nd, Ir, Cr, Ca, Ti, Ta, W, and/or Cu.

Each signal line PAD of the plurality of signal lines PAD and each lead line LE of the plurality of lead lines LE may be disposed to overlap each other in the thickness direction. For example, each signal line PAD of the plurality of signal lines PAD and each lead line LE of the plurality of lead lines LE may be disposed to face each other. The plurality of signal lines PAD may be spaced apart from each other in the first direction DR1, and the plurality of lead lines LE may also be spaced apart from each other in the first direction DR1.

The plurality of signal lines PAD and the plurality of lead lines LE may be disposed to have a substantially identical or identical pitch PIT'. The pitch PIT' of the plurality of signal lines PAD may be a distance from one side of the signal line PAD to one side of the adjacent signal line PAD. The pitch PIT' of the plurality of lead lines LE may be a distance from side of the lead line LE to one side of the adjacent lead line LE. The pitch PIT' of the plurality of signal lines PAD and the plurality of lead lines LE may be substantially the same or the same as the pitch PIT of the plurality of through holes H of the adhesive member AD. In one embodiment of the present inventive concept, the plurality of signal lines PAD and the plurality of lead lines LE are arranged at a constant pitch PIT', but the present inventive concept is not limited thereto. In an embodiment of the present inventive concept, the plurality of signal lines PAD and the plurality of lead lines LE may be arranged to have an irregular pitch PIT'.

The plurality of signal lines PAD may be disposed to protrude from one surface of the first substrate SUB1, and the plurality of lead lines LE may be disposed to protrude from one surface of the printed circuit board 500. When the display panel 100 and the printed circuit board 500 are pressed, the plurality of lead lines LE may respectively press first sides of the plurality of conductive members CDM so that the plurality of lead lines LE may be accommodated in the plurality of through holes H through first side openings of the plurality of through holes H, respectively, and the plurality of signal lines PAD may respectively press the second sides (e.g., the opposing sides) of the plurality of conductive members CDM so that the plurality of signal lines PAD may be accommodated in the plurality of through holes H through the second side openings (e.g., the opposing side openings) of the plurality of through holes H, respectively.

The display device 1 may further include an adhesive member AD interposed between the display panel 100 and the printed circuit board 500. The adhesive member AD may include the adhesive member AD, ADa, ADb, ADc, ADe, or ADf illustrated in FIGS. 1 to 9.

The adhesive member AD may bond the display panel 100 and the printed circuit board 500 to each other. The adhesive member AD may electrically connect the plurality of signal lines PAD of the display panel 100 and the plurality of lead lines LE of the printed circuit board 500 to each other.

The adhesive member AD may include a base layer AD_M, a first adhesive layer AD_T, a second adhesive layer AD_B, a plurality of through holes H, and a plurality of conductive members CDM.

The base layer AD_M may include, for example, aluminum oxide. The base layer AD_M may be an anodic aluminum oxide template.

The first adhesive layer AD_T may be interposed between the base layer AD_M and the printed circuit board 500. The first adhesive layer AD_T may bond the printed circuit board 500 and the base layer AD_M to each other. For example, the first adhesive layer AD_T may be in direct contact with one surface of the printed circuit board 500.

The second adhesive layer AD_B may be interposed between the base layer AD_M and the first substrate SUB1. The second adhesive layer AD_B may bond the first substrate SUB1 and the base layer AD_M. For example, the second adhesive layer AD_B may be in direct contact with one surface of the first substrate SUB1.

As described above, the first adhesive layer AD_T and the second adhesive layer AD_B may be made of resins having different adhesions. In one embodiment of the present inventive concept, the first adhesive layer AD_T may be made of an acrylic-based resin, and the second adhesive layer AD_B may be made of an epoxy-based resin.

The plurality of through holes H may be disposed to overlap the plurality of signal lines PAD and the plurality of lead lines LE in the thickness direction. The plurality of through holes H may be arranged at the same pitch PIT as the plurality of signal lines PAD and the plurality of lead lines LE. At least a portion of each signal line PAD may be accommodated in one side opening of each respective through hole H of the plurality of through holes H, and at least a portion of each lead line LE, may be accommodated its the other side opening of each respective through bole H of the plurality of through holes H. In one embodiment of the present inventive concept, at least some of the plurality of signal lines PAD and the plurality of lead lines LE may be accommodated in a plurality of through holes of the base layer AD_M, respectively. In an embodiment of the present inventive concept, the plurality of lead lines LE and the plurality of signal lines PAD may be accommodated only in a plurality of through holes of the first adhesive layer AD_T and a plurality of through holes of the second adhesive layer respectively. In an embodiment of the present inventive concept, the plurality of lead lines LE and the plurality of signal lines PAD may not be accommodated in a plurality of through holes H of the base layer AD_M.

The plurality of signal lines PAD and the plurality of lead lines LE may each have a size that is less than a size of each of the plurality of through holes H. In an embodiment of the present inventive concept, as shown in FIG. 13, a width in the first direction DR1 of each of the plurality of signal lines PAD and the plurality of lead lines LE may be less than that of the plurality of through holes H. As shown in FIG. 11, a width in the second direction DR2 of each of the plurality of signal lines PAD and the plurality of lead lines LE may be less than that of the plurality of through holes H. Accordingly, at least one side surface of each of the plurality of signal lines PAD and the plurality of lead lines LE may be disposed to be spaced apart from an inner side surface of each of the plurality of through holes H. For example, a distance between the side surface of each of the plurality of signal lines PAD and/or the plurality of lead lines LE and the inner side surface of the through hole may be in a range of about 1 μm to about 3 μm. In an embodiment of the present inventive concept, the plurality of signal lines PAD and the plurality of lead lines LE may each have the same size as each of the plurality of through holes H, and the plurality of signal lines PAD and the plurality of lead lines LE may each be in contact with the inner side surface of each of the plurality of through holes H. In an embodiment of the present inventive concept, in the through hole, a size of one side opening which faces the printed circuit board 500 and in which the one lead line LE is accommodated may be different from a size of the other side opening which faces the first substrate SUB1 and in which the one signal line PAD is accommodated. For example, as shown in FIG. 6, the plurality of through holes H may each have a tapered shape, or as shown in FIG. 7, the plurality of through holes H may be formed to each have a step ST. In this case, the size of the signal line PAD may be greater than the size of the lead line LE, and the size of the other side (e.g., a lower side) opening may be greater than the size of the one side (e.g., an upper side) opening.

The plurality of conductive members CDM may be accommodated in the plurality of through holes H, respectively. The plurality of conductive members CDM may fill a space formed by the plurality of through holes H, one surface of the first substrate SUB1, and one surface of the printed circuit board 500. For example, the conductive members CDM may electrically connect the plurality of lead lines LE and the plurality of signal lines PAD to each other. In one embodiment of the present inventive concept, conductive particles dispersed in an insulating adhesive material may be interposed between the plurality of lead lines LE and the plurality of signal lines PAD to electrically connect the plurality of lead lines LE and the plurality of signal lines PAD to each other. The conductive particles may include, for example, conductive halls, nanowires, and nanosprings.

In one embodiment of the present inventive concept, the space may be completely filled by the plurality of conductive members CDM. In an embodiment of the present inventive concept, the space may include at least one air gap, for example, between the lead line LE and the inner side surface of the through hole, between the conductive members CDM and the fast substrate SUB1, and between the conductive members CDM and the printed circuit board 500.

The plurality of conductive members CDM may be deformed in shape by being pressed. For example, when the display panel 100 and the printed circuit board 500 are bonded, the adhesive member AD may be interposed between an area in which the plurality of signal lines PAD of the display panel 100 are disposed and an area in which the plurality of lead lines LE of the printed circuit board 500 are disposed. When the display panel 100 and/or the printed circuit board 500 are pressed, first sides of the plurality of conductive members CDM may be pressed in the thickness direction by the plurality of lead lines LE, and second sides of the plurality of conductive members CDM may be recessed in the thickness direction by the plurality of signal lines PAD. Accordingly, insides of the plurality of through holes H are filled with the plurality of conductive members CDM, respectively, and the first side and the second side of each of the plurality of conductive members CDM may have a shape recessed in the thickness direction. For example, the plurality of conductive members CDM may be recessed by the plurality of lead lines LE and the plurality of signal pads PAD.

Figure 14:
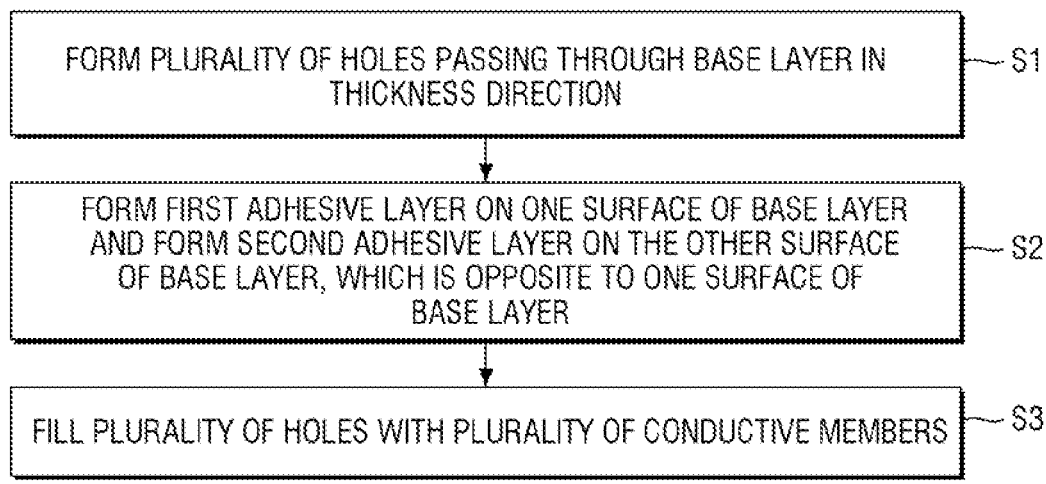
FIG. 14 is a flowchart illustrating, a method of manufacturing a display device according to an embodiment of the present inventive concept.

FIG. 14 is a flowchart illustrating a method of manufacturing a display device according to an embodiment of the present inventive concept. FIGS. 15 to 19 are views illustrating steps of the method of manufacturing a display device according to an embodiment of the present inventive concept.

A display device manufactured by the following display device manufacturing method may be the display device of FIG. 10, but the present inventive concept is not limited thereto. The method of manufacturing a display device may include a method of manufacturing the adhesive member AD.

Referring to FIG. 14, the method of manufacturing a display device may include forming a plurality of through holes H, which pass through a base layer AD_M in a thickness direction, in the base layer AD_M (S1). The method may further include forming a first adhesive layer AD_T on one surface of the base layer AD_M and forming a second adhesive layer AD_B on the other surface of the base layer AD_M, which is opposite to one surface of the base layer AD_M (S2), and filling the plurality of through holes H with a plurality of conductive members CDM, respectively (S3).

The method of manufacturing a display device may further include interposing the base layer AD_M, the first adhesive layer AD_T, and the second adhesive layer AD_B between a display panel 100 and a printed circuit board 500 to bond the display panel 100 and the printed circuit board 500 to each other.

The bonding of the display panel 100 and the printed circuit board 500 to each other may further include aligning a plurality of signal lines PAD of the display panel 100, a plurality of lead lines LE of the printed circuit board 500, and the plurality of conductive members CDM to overlap each other in the thickness direction and applying pressure to insert the plurality of signal lines PAD and the plurality of lead lines LE into the plurality of through holes H, respectively.

The forming of the plurality of through holes H may include forming patterns on an aluminum plate and anodizing the aluminum plate.

The steps of the method of manufacturing a display device are examples, and, for example, one or more of the steps may be omitted, or one or more steps may be added.

Figure 15:
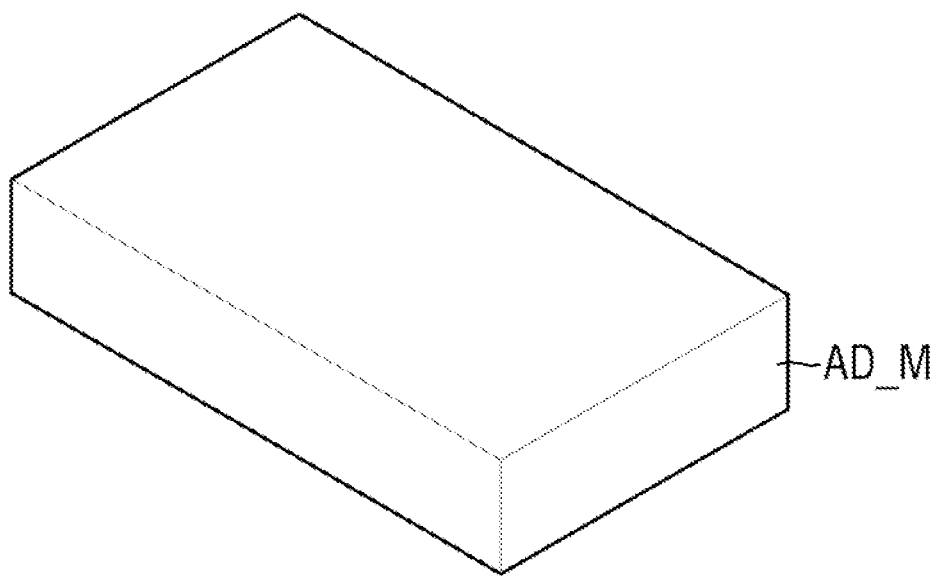
FIGS. 15, 16, 17, 18 and 19 are views illustrating steps of the method of manufacturing a display device according to an embodiment of the present inventive concept.

Referring to FIG. 15, the base layer AD_M may be prepared. The base layer AD_M may be formed of, for example, a cuboid or a flat plate-shaped member, but the present inventive concept is not limited thereto. The base layer AD_M may be made of a metal. The metal may include, for example, aluminum. In one embodiment of the present inventive concept, the base layer AD_M may be an aluminum plate having a relatively small thickness.

Figure 16:
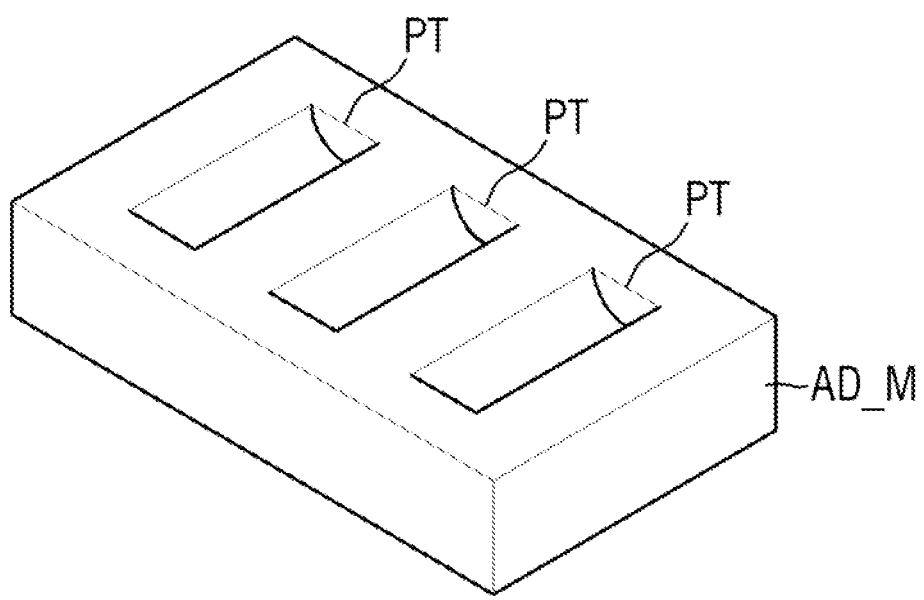

Referring to FIG. 16, a plurality of patterns PT may be formed on one surface of the base layer AD_M. The plurality of patterns PT may be recessed in the base layer AD_M. The plurality of patterns PT may vary depending on the shapes of the plurality of through holes H (in FIG. 14) to be formed. For example, the plurality of patterns PT may each be a slit elongated in a first direction in a plan view. In another example, the plurality of patterns PT may each have a rectangular shape or a circular shape in a plan view. The plurality of patterns PT may be formed by pressing one surface of the base layer AD_M with a pressing; member having a shape corresponding to that of the plurality of patterns PT. In an embodiment of the present inventive concept, the plurality of patterns PT may be formed by laser etching.

Figure 17:
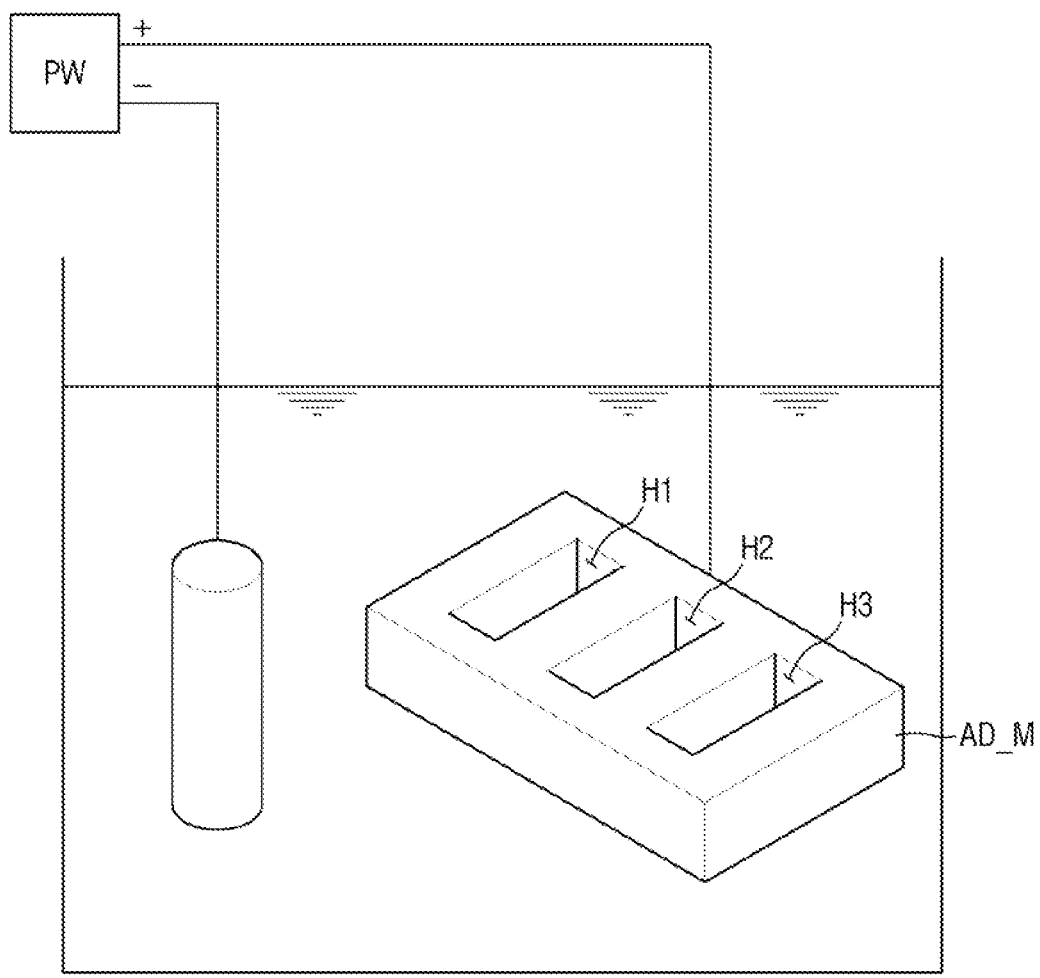

Referring to FIG. 17, the plurality of through holes H, which pass through the base layer AD_M in the thickness direction, may be formed. The plurality of through holes H may be formed in a shape corresponding to the shape of the plurality of patterns PT. For example, the plurality of through holes H may be formed to each be a slit elongated in the first direction in a plan view. The hole may include pores to be described later.

In one embodiment of the present inventive concept, the base layer AD_M may be an aluminum plate, and a plurality of fine pores passing through the aluminum plate may be formed through an anodizing process in which the aluminum plate connected to an anode is immersed in an acid solution. For example, the aluminum plate may be anodized to form an anodic aluminum oxide template. In an embodiment of the present inventive concept, by adjusting the voltage applied from a power source PW to the aluminum plate, the plurality of through holes H may be formed to each have a tapered shape as shown in FIG. 6 or may be formed to each have a step as shown in FIG. 7.

Figure 18:
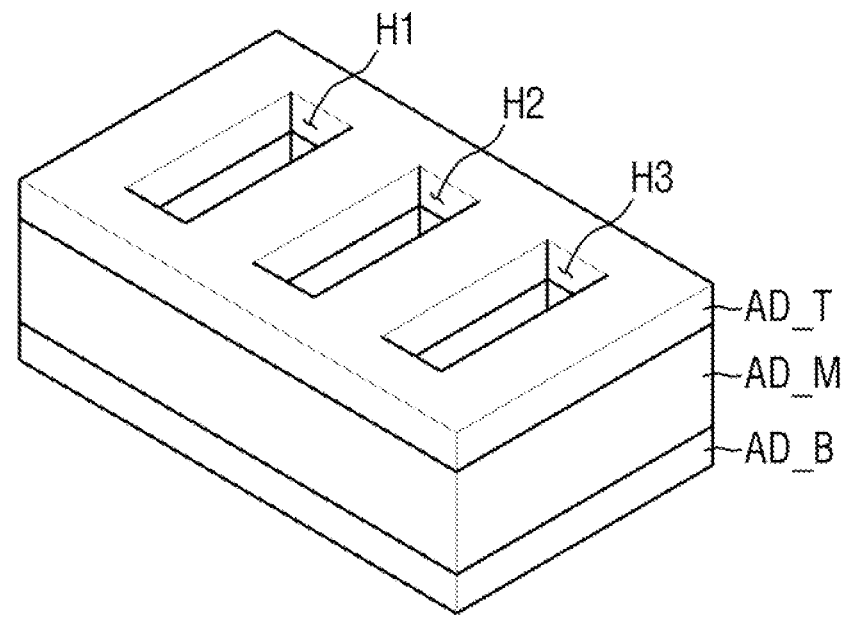

Referring to FIG. 18, the first adhesive layer AD_T and the second adhesive layer AD_B may be formed on a first surface and a second surface of the base layer AD_M, respectively. The first adhesive layer AD_T and the second adhesive layer AD_B may be applied to form a plurality of through holes H that overlap the plurality of through holes H of the base layer AD_M, respectively, in the thickness direction. Accordingly, the plurality of through holes H passing through the base layer AD_M, the first adhesive layer AD_T, and the second adhesive layer AD_B in the thickness direction may be formed. In one embodiment of the present inventive concept, the first adhesive layer AD_T and the second adhesive layer AD_B may be applied by an inkjet printing method, but the present inventive concept is not limited thereto.

Figure 19:
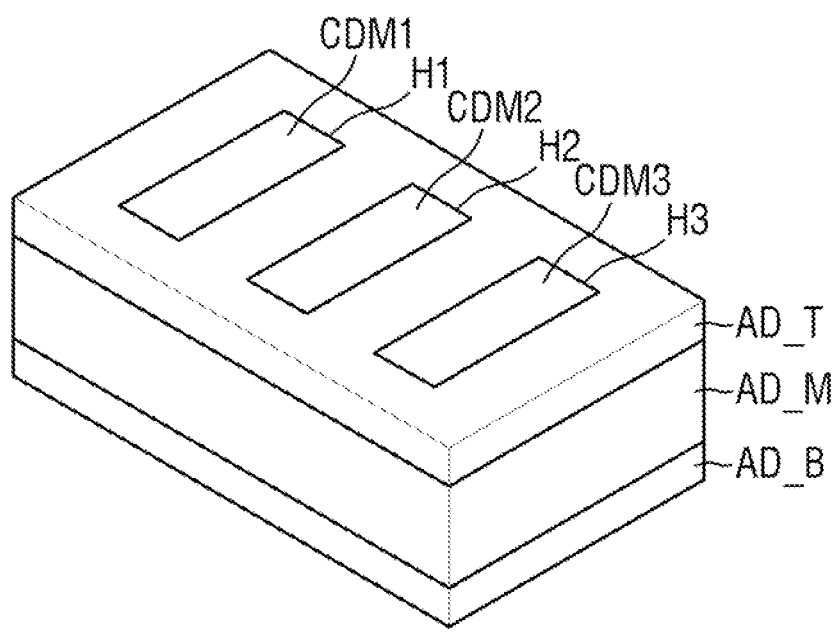

Referring to FIG. 19, the plurality of through holes H may be filled with the plurality of conductive members CDM, respectively. In one embodiment of the present inventive concept, the plurality of conductive members CDM may be filled therein by an inkjet printing method, but the present inventive concept is not limited thereto. For example, the adhesive member AD of FIG. 1 may be manufactured through the above-described operations.

Afterward, with further reference to FIGS. 10 to 13, the adhesive member AD may be interposed between the display panel 100 and the printed circuit board 500 to bond the display panel 100 and the printed circuit board 500 to each other. For example, the plurality of signal lines PAD of the display panel 100, the plurality of lead lines LE of the printed circuit board 500, and the plurality of conductive members CDM are arranged to overlap each other in the thickness direction, and the display panel 100 and/or the printed circuit board 500 may be pressed so that the plurality of signal lines PAD and the plurality of lead lines LE are inserted into the plurality of through holes H, respectively.

An adhesive member, a display device, and a method of manufacturing the display device according to an embodiment of the present inventive concept may reduce connection failure and increase adhesion.

Effects according to an embodiment of the present inventive concept are not limited by the content exemplified above, and more various effects may be included in the present inventive concept.

While the present inventive concept has been particularly shown and described with reference to the embodiments thereof, it will be understood by those of ordinary skill in the art that various changes in form and detail may be made thereto without departing from the spirit and scope of the present inventive concept as set forth in the following claims.

What is claimed is:
1. A display device comprising:
a display panel including a plurality of signal lines;
a printed circuit board including a plurality of lead lines overlapping the plurality of signal lines in a thickness direction, respectively; and
an adhesive member interposed between the display panel and the printed circuit board, wherein the adhesive member includes a plurality of through holes and a plurality of conductive members, wherein the plurality of through holes are arranged at the same pitch as that of the plurality of signal lines and the plurality of lead lines, wherein each of the plurality of through holes has a first side opening, in which one lead line of the plurality of lead lines is accommodated, and a second side opening, in which one signal line of the plurality of signal lines is accommodated, and wherein the plurality of conductive members are respectively disposed in the plurality of through holes.

2. The display device of claim 1, wherein the adhesive member includes:

a base layer;

a first adhesive layer interposed between the base layer and the printed circuit board; and a second adhesive layer interposed between the base layer and the display panel, wherein the plurality of through holes pass through the base layer, the first adhesive layer, and the second adhesive layer in the thickness direction, and wherein the plurality of conductive members are disposed in the plurality of through holes, respectively.

3. The display device of claim 2, wherein the first adhesive layer includes an acrylic-based resin, and the second adhesive layer includes an epoxy-based resin.

4. The display device of claim 1, wherein the conductive member includes at least one of a nanowire, a nanospring, or a conductive ball.

5. The display device of claim 2, wherein the base layer includes aluminum oxide.

6. The display device of claim 5, wherein the base layer includes an anodic aluminum oxide template.

7. The display device of claim 1, wherein each of the plurality of signal lines and each of the plurality of lead lines are spaced apart from respective inner side surfaces of the plurality of through holes.

8. The display device of claim 1, wherein, in each of the through holes, a size of the first side opening is different from a size of the second side opening.

* * * * *